United States Patent [19]
Kajita et al.

[11] Patent Number: 5,953,634
[45] Date of Patent: Sep. 14, 1999

[54] METHOD OF MANUFACTURING SEMICONDUCTOR DEVICE

[75] Inventors: Akihiro Kajita, Yokohama; Hisashi Kaneko, Fujisawa, both of Japan

[73] Assignee: Kabushiki Kaisha Toshiba, Kawasaki, Japan

[21] Appl. No.: 08/600,026

[22] Filed: Feb. 12, 1996

[30] Foreign Application Priority Data

Feb. 13, 1995 [JP] Japan ................................. 7-046586
Feb. 9, 1996 [JP] Japan ................................. 8-024073

[51] Int. Cl.$^6$ ................................................. H01L 21/44
[52] U.S. Cl. ..................... 438/687; 438/635; 438/680; 438/681
[58] Field of Search ................................. 437/192, 195, 437/198; 438/473, 483, 644, 654, 655, 704, 705, 714, 720, 722, 723, 724, 635, 680, 681, 687

[56] References Cited

U.S. PATENT DOCUMENTS

| 4,880,959 | 11/1989 | Baum et al. ........................ 219/121.85 |
| 5,126,283 | 6/1992 | Pintchovski et al. .................... 437/188 |
| 5,171,734 | 12/1992 | Sanjurjo et al. ............................. 505/1 |
| 5,424,246 | 6/1995 | Matsuo et al. ............................ 437/192 |
| 5,527,739 | 6/1996 | Parrillo et al. ........................... 437/198 |
| 5,736,002 | 4/1998 | Allen et al. ........................... 156/628.1 |

FOREIGN PATENT DOCUMENTS

WO 91/17284 11/1991 WIPO.

OTHER PUBLICATIONS

J. Electrochem. Soc., vol. 141, No. 12, pp. 3539–3546, Dec. 1994, J. Farkas, et al., "FTIR Studies of the Adsorption/Desorption Behavior of Cu Chemical Vapor Deposition Precursors on Silica".

Journal of Electrochem. Soc., vol. 141, No. 12, pp. 3547–3555, Dec. 1994, J. Farkas, et al., "FTIR Studies of the Adsorption/Desorption Behavior of Cu Chemical Vapor Deposition Precursors on Silica".

Appl. Phys. Letter, vol. 61, No. 22, pp. 2662–2664, Nov. 30, 1992, A. Jain, et al., "Control of Selectivity During Chemical Vapor Deposition of Copper from Copper (I) Compounds via Silicon Dioxide Surface Modification".

Carter W. Kaanta, et al., "Dual Damascene: A ULSI Wiring Technology", VLSI Multilever Interconnection Conference Proceedings, pp. 144–152, Jun. 11–12, 1991.

Scott K. Reynolds, et al., "Chemical Vapor Deposition of Copper from 1,5–cyclooctadiene copper (1) hexafluoroacetylacetonate", Applied Physics Letter, vol. 59, No. 18, pp. 2332–2334, Oct. 28, 1991.

Nobuyoshi Awaya, et al., "Double–level Copper Interconnections Using Selective Copper CVD", VLSI Multilevel Interconnection Conference Proceedings, pp. 254–260, Jun. 12–13, 1990.

(List continued on next page.)

*Primary Examiner*—Charles Bowers
*Assistant Examiner*—Reneé R. Berry
*Attorney, Agent, or Firm*—Oblon, Spivak, McClelland, Maier & Neustadt, P.C.

[57] ABSTRACT

A method of manufacturing a semiconductor device comprising the steps of, forming a diffusion-preventing thin film on a substrate, performing a first vapor deposition by supplying a source gas comprising a copper-containing organometallic compound and an oxidizing gas over the diffusion-preventing thin film thereby to allow a first conductive thin film containing copper as a main component and a trace of oxygen to be grown through a chemical vapor deposition, performing a second vapor deposition by supplying the source gas without supplying the oxidizing gas thereby to allow a second conductive thin film mainly containing copper to be grown through a chemical vapor deposition, and heat-treating the first and second conductive thin films at a temperature which is higher than those employed in the first and second vapor depositions.

22 Claims, 14 Drawing Sheets

OTHER PUBLICATIONS

J.A.T. Norman, et al., "New OMCVD Precursors for Selective Copper Metallization", Journal de Physique IV, Colloque C2, suppl. au Journal de Physique II, vol. 1, pp. c2-271-278, Sep. 1991.

A.V. Gelatos, et al., "Chemical Vapor Deposition of Copper for Advanced On-chip Interconnects", MRS Bulletin, vol. XIX, No. 8, pp. 49-54, No date.

Z. Hammadi, et al., "Chemical-vapor Deposition of Metallic Copper Film in the Presence of Oxygen", Journal of Applied Physics, vol. 73, No. 10, pp. 5213-5215, May 15, 1993.

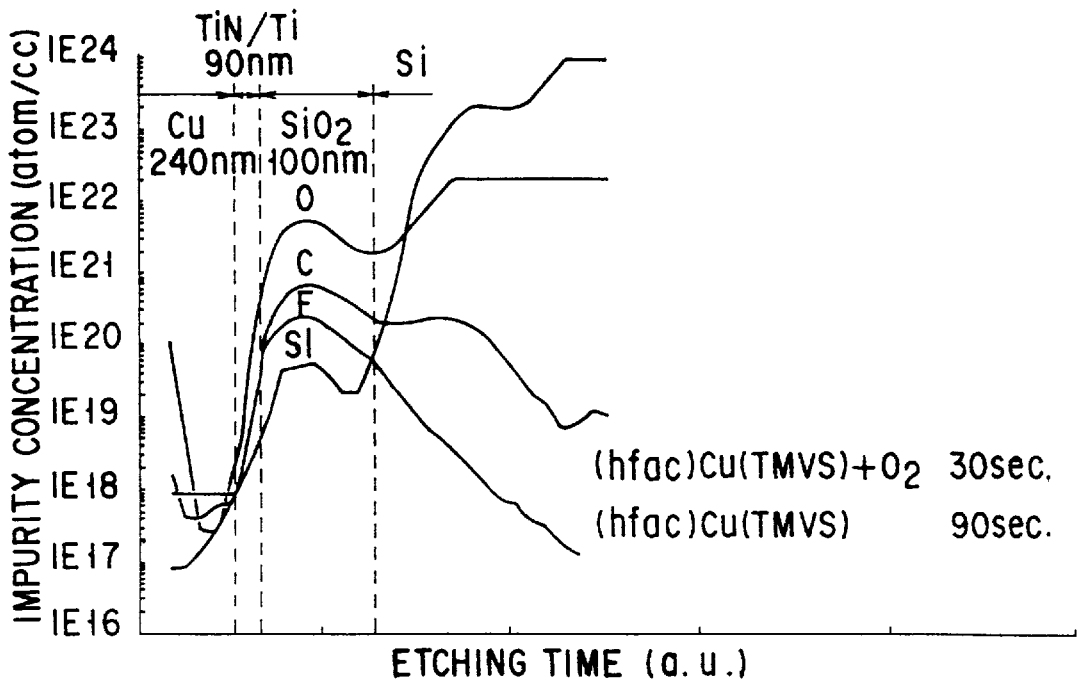
F I G. 2A
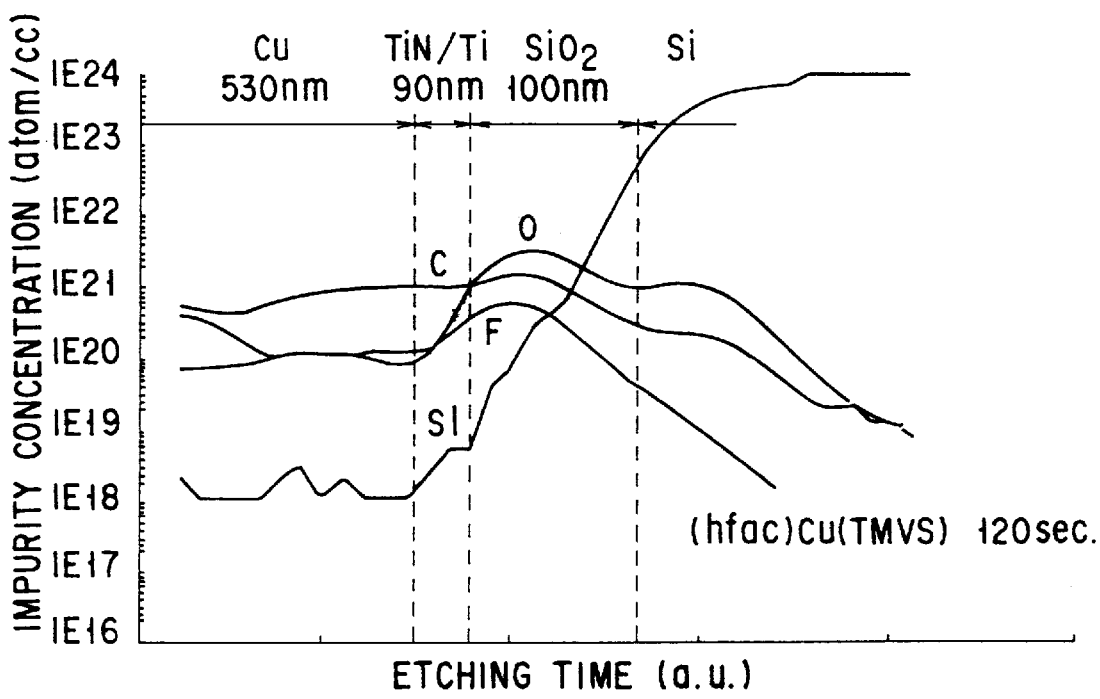
F I G. 2B

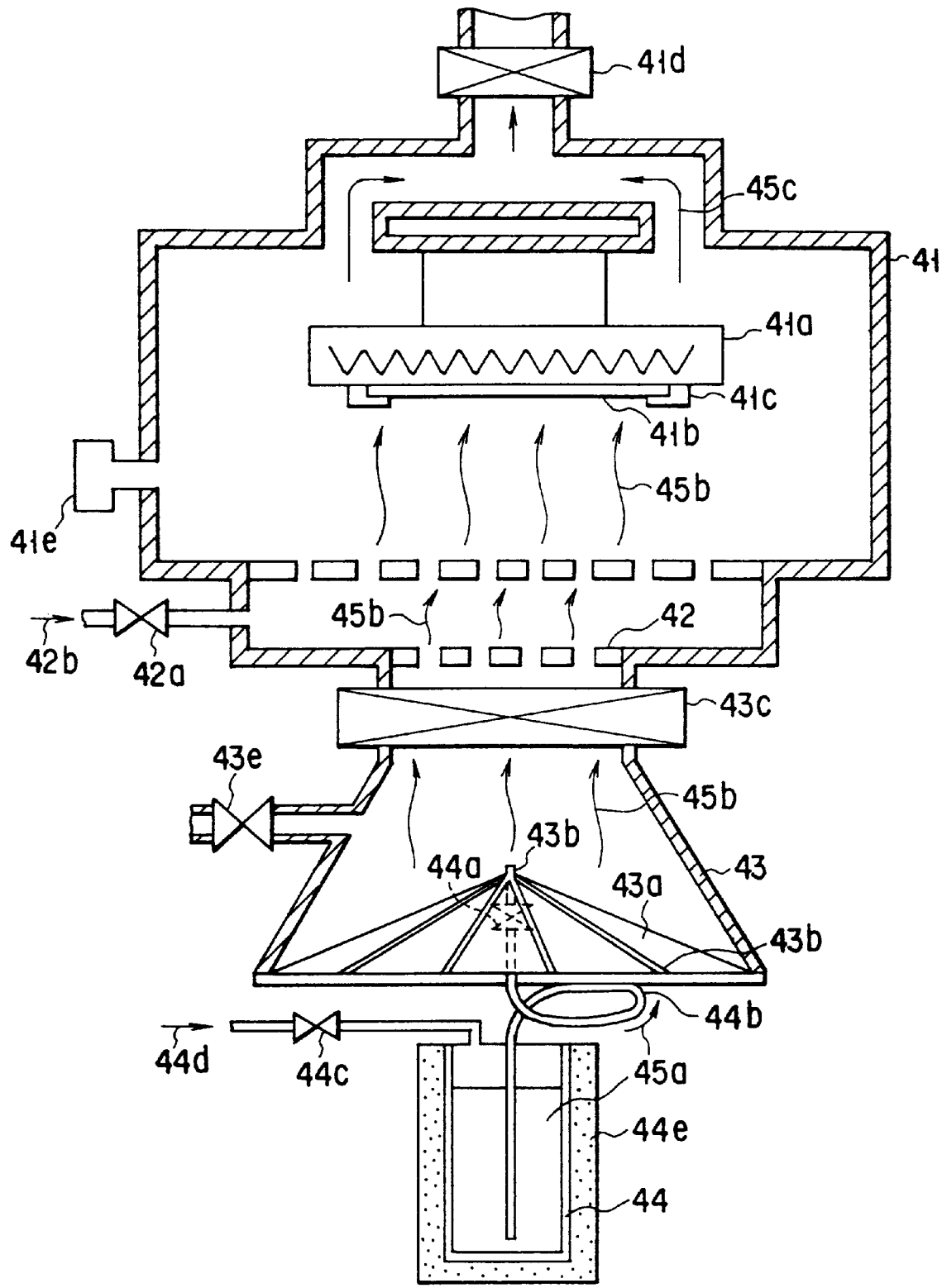
F I G. 6

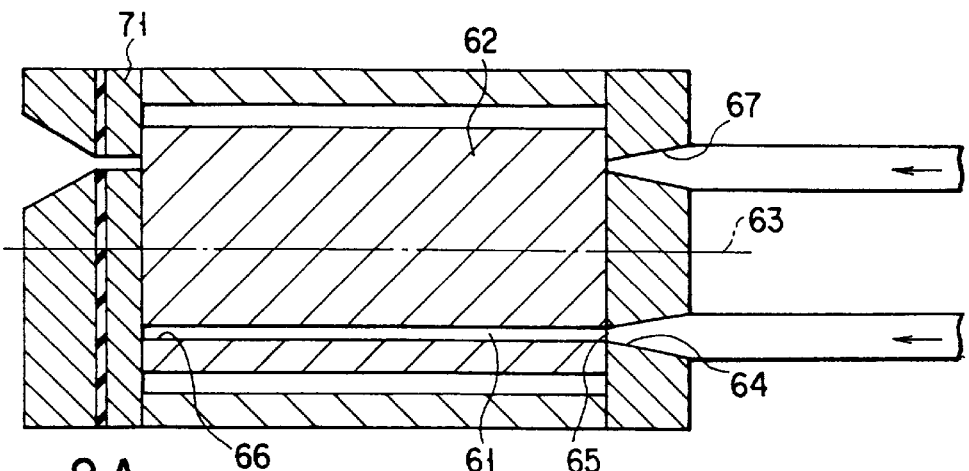
F I G. 8A
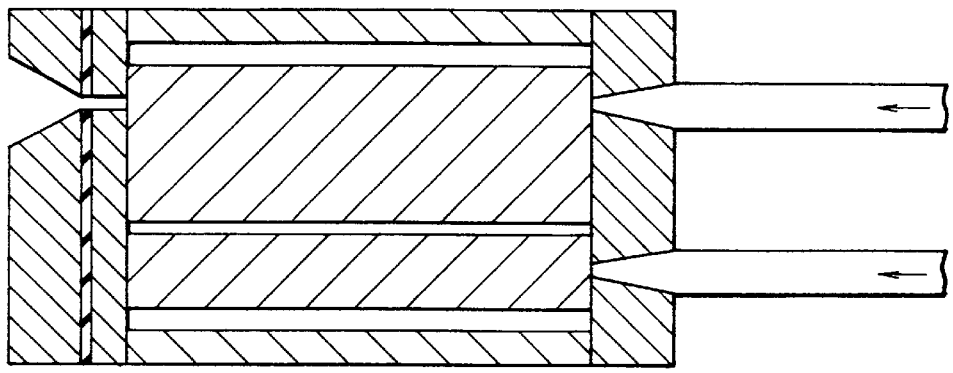
F I G. 8B
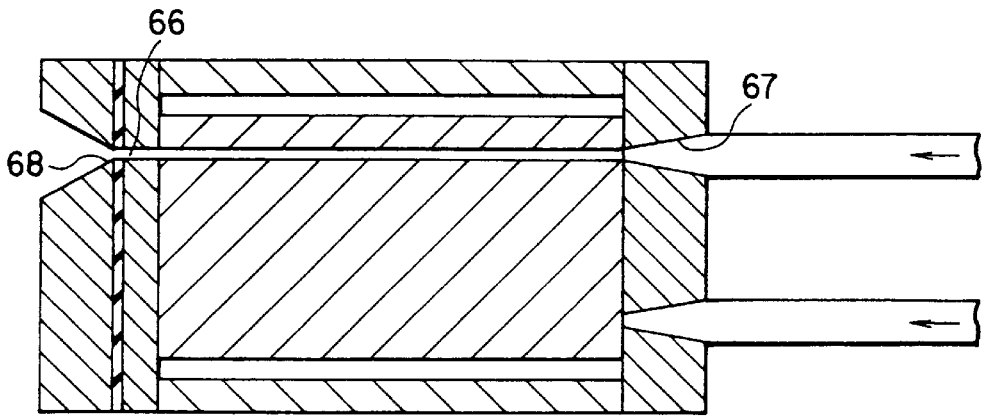
F I G. 8C

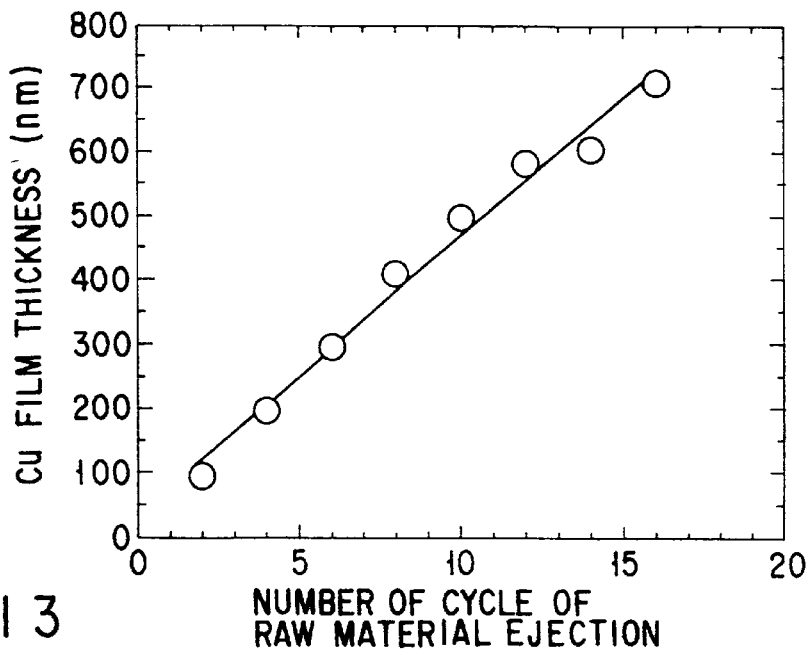
F I G. 13
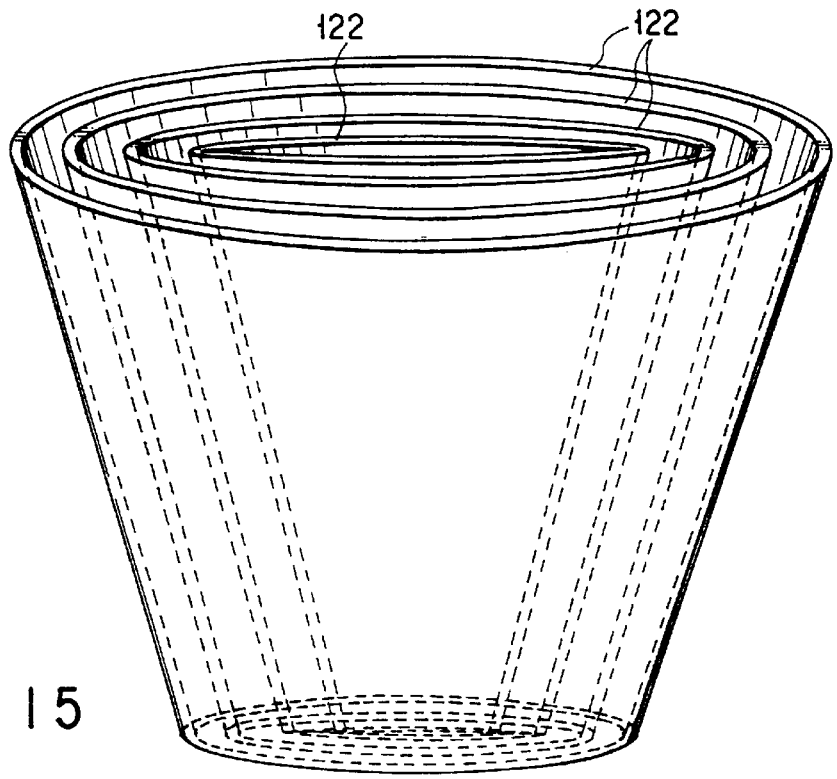
F I G. 15

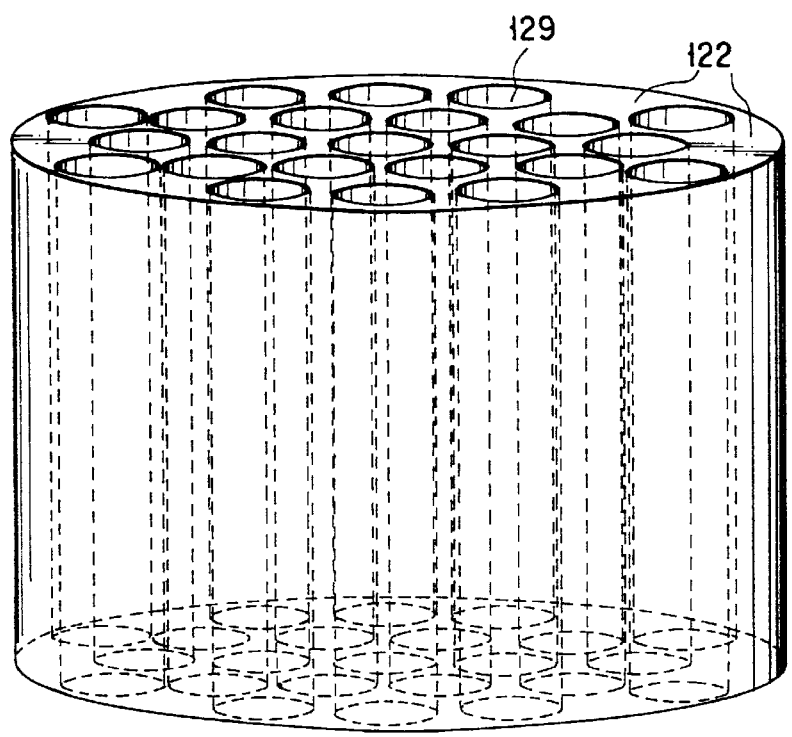
F I G. 16
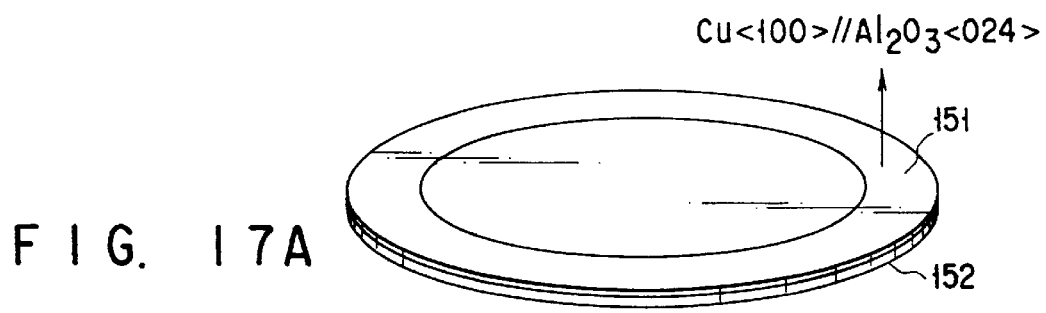
F I G. 17A
F I G. 17B
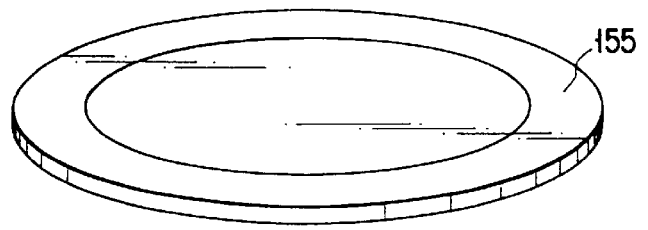
F I G. 17C

METHOD OF MANUFACTURING SEMICONDUCTOR DEVICE

BACKGROUND OF THE INVENTION

1. Field of the Invention

This invention relates to a method of manufacturing a semiconductor device having a thin metal layer which can be utilized as a fine interconnecting wiring or an electrode.

2. Description of the Related Art

Al (aluminum) or Al alloy is generally employed as a material for a fine metallic interconnecting wiring in a semiconductor device such as a DRAM or a microprocessor. However, in view of an increasing demand for a higher operation speed of semiconductor device, a metallic material having a lower electric resistance than Al is desired for using it as an interconnecting wiring. This is because the RC delay of electric signals due to a capacitance between fine interconnecting wirings becomes an obstacle in a high speed operation of a semiconductor device, so that the lowering in resistance of the interconnecting wirings is an effective way of minimizing this RC delay. Therefore, Cu (copper) metal having a lower electric resistivity (1.7 $\mu\Omega\cdot$cm) as compared with Al metal (2.8 $\mu\Omega\cdot$cm) has recently been studied for use as a material for fine interconnecting wirings.

Since Cu is higher in activation energy for self-diffusion as compared with Al metal, and highly resistive to a phenomenon such as a stress-migration or an electro-migration which is effected by the diffusing behavior of a metal atom constituting the interconnecting wiring, it is possible by the employment of Cu to improve the reliability of interconnecting wirings.

However, in spite of these excellent properties to be derived from the use of Cu interconnecting wirings, the Cu interconnecting wirings are not yet put to industrial use because of the following reasons. A fine metallic interconnecting wiring to be employed in a semiconductor device is generally formed through a process including the steps of patterning a photo-resist by way of lithography and reactive ion-etching the thin film of an interconnecting metal using as a mask the photo-resist thus patterned. However, there is a problem in the case of Cu thin film that it is difficult to perform a working on the Cu thin film for forming a fine interconnecting wiring through a dry-etching technique such as a reactive ion-etching.

In view of this problem, there is recently studied a method wherein a trench is formed in advance in an insulating film formed in an interconnecting wiring-forming region of a substrate, a thin film of a metal such as Cu is uniformly deposited on the substrate provided with this trench, and all of the metallic thin film excluding those deposited in the trench is removed by way of mechanical polishing or chemical-mechanical polishing thereby finally forming a buried interconnecting wiring.

In order to obtain this buried interconnecting wiring, the Cu thin film is required to be uniformly buried within the trench. According to a physical vapor deposition (PVD) method such as a sputtering method, however, the incident direction of atoms to the substrate to be deposited with the atoms is not anisopropic, so that voids are more likely to be formed in the resultant thin film. Moreover, a connecting hole such as a via hole for achieving an electric connection between layers of a multi-layered inter-connection is generally high in aspect ratio as compared with the trench for interconnecting wiring, so that it is much more difficult to uniformly deposit a Cu thin film in such a connecting hole by way of a PVD method. Hence, a chemical vapor deposition method (CVD) which is excellent in step coverage is considered to be a promising method for depositing a Cu thin film.

However, there is a problem as explained below in the deposition of a Cu thin film by means of the CVD method. Namely, since Cu is ready to diffuse into a silicon oxide film and a silicon layer, the electric properties of a transistor would be badly affected if Cu atoms are diffused into an active region of the transistor. In order to prevent the Cu atoms from diffusing into an active region of the transistor from an interconnection wiring, various measures such as the formation of a diffusion-preventing thin film (a barrier layer) under a Cu wiring layer, or the encapsuling of a Cu wiring with a barrier layer have been taken. In this case, a nitride of a refractory metal such as TiN is employed as a barrier layer. However, this kind of barrier layer is poor in adhesion to a Cu thin film. Therefore, a Cu thin film is liable to be stripped off in the step of polishing or in the step of thermal treatment after the deposition of Cu thin film, thus raising a problem.

The cause of this stripping of Cu thin film is considered to be ascribed to an oxide film formed spontaneously (a natural oxide film) on the surface of the underlayer which weakens the adhesion between the Cu thin film and the underlayer. This oxide film formed on the surface of the underlayer is an oxide of a refractory metal which is thermally stable. Accordingly, in order to improve the adhesion of the underlying barrier layer to a Cu thin layer overlaid thereon through a reaction with the Cu thin layer, a heat treatment at such a high temperature that can not be applicable in the ordinary manufacturing process of a semiconductor device would be required.

As another means for improving the adhesion of the underlying barrier layer to a Cu thin layer, there is proposed a method wherein the aforementioned natural oxide film is etched off at first by making use of a sputtering phenomenon, i.e. by impinging an inert gas ion such as Ar$^+$ ion at high energy on the substrate, and then a Cu thin film is deposited over the underlying barrier layer. One example of such a method is disclosed in an article by S. K. Reynolds et al (Applied Physics Letter, Vol.59, P.2332–2334 (1991)) wherein the surface of Ta underlying layer is subjected to sputtering using Ar ions and then Cu is grown through a chemical vapor deposition under a condition inhibiting the reoxidation of the surface of the underlying layer, thus allegedly achieving an excellent adhesion between the Cu layer and the underlying barrier layer.

However, when the surface features of a substrate to be deposited with Cu are of a trench pattern for forming a afore-mentioned buried interconnecting wiring, or of a hole pattern for forming contact holes or via holes, it is very difficult to uniformly etch off the oxide film, since there is a directivity in incident ions, giving rise to non-uniformity of etching at depressed portions. Moreover, there is a further problem that it requires, in addition to a CVD apparatus, another apparatus for cleaning a substrate or for depositing the underlayer, which should be connected with a vacuum chamber of the CVD apparatus, thus necessitating the enlargement of apparatus or the increase of manufacturing steps.

There has been proposed a further method for improving the adhesion between an underlying barrier layer and a Cu thin layer, wherein another thin film (an adhesive layer) is interposed between the underlying barrier layer and the Cu thin layer. For example, Ti is deposited on the underlying barrier layer before Cu is deposited. According to this method, it is possible to achieve an excellent adhesion between the underlying barrier layer and the Cu thin layer if a suitable material is selected as an adhesive layer. However, this method is also accompanied with the following problem. Namely, the surface of this adhesive layer should be free from a natural oxide film thereof. Further, with an increase in fineness of interconnecting wiring pattern, the ratio of total sectional area of the adhesive layer and the barrier layer which are relatively high in electric resistance in relative to the sectional area of the interconnecting wiring becomes larger, thus increasing the resistance of the interconnecting wiring. In view of this aspect also, it is not preferable to additionally deposit such an adhesive layer.

As explained above, there is a problem in the conventional method of forming a Cu thin film for use in a fine interconnecting wiring, in particular by means of a CVD method, that adhesion between the underlying barrier layer and the Cu thin film is poor. Furthermore, if the Cu thin film for wiring is to be formed by means of the CVD method, elements constituting a source gas, i.e. an organometallic compound excluding Cu, for example elements such as C, O and F in the case of an organic copper compound having hexafluoroacetyl acetone group may be mingled as impurities into a resultant Cu thin film. In this case, the amount of these impurities that may be mingled into a Cu thin film depends on the various conditions at the time forming the Cu thin film by means of the CVD method, in particular the film-forming temperature. In any ways, it is unavoidable in this case to allow the incorporation of several thousands ppm of these impurities in the Cu thin film even if the film-forming conditions are optimized. The presence of these impurities gives rise to an increase in resistance of the Cu thin film.

The inclusion of these impurities in the Cu thin film formed by way of the CVD method is brought about by the incorporation of elements attached to the ligand of an organic compound constituting a CVD source gas such for example as C or O into the Cu thin film in the course of the chemical vapor deposition of Cu. Therefore, an effort to purify a CVD-Cu thin film has been concentrated on how to modify the molecular structure of the organic copper compound constituting a CVD source gas. Specifically, in order to prevent the elements attached to the ligand of an organic compound from being intermingled into a resultant Cu thin film, the selection as a source gas of an organic copper compound whose ligand or CVD reaction products is relatively high in vapor pressure has been studied. Alternatively, in order to inhibit the incorporation of impurities due to the thermal decomposition of the ligand in the course of the chemical vapor deposition, the modification of an organic copper compound so as to lower the film-forming temperature has been studied.

As a result, it has been reported that the employment as a CVD source gas of an organic compound comprising hexafluoroacetylacetonate copper (monovalent copper compound) having various neutral olefin ligand or alkyne ligand attached thereto is suited for obtaining a copper film which is excellent in step-coverage and in other various properties. One of the typical examples of such an organic copper compound, i.e. (Hfac) Cu (tmvs) (hexafluoroacetylacetonate trimethylvinylsilane copper) is reported in an article by J. A. T. Norman et al (Journal de Phisique IV, Colloque C2, pp271–278(1991)).

According to this article, the impurity elements in a Cu film is analyzed by way of Auger electron spectroscopy (AES). However, according to such an analyzing method, the detection limit of impurities such as C, F and O is about 1% at most. By contrast, when such impurities were analyzed as hereinafter explained in the experiments performed by the present inventors by using a secondary ion mass spectrometry (SIMS) which is more sensitive in detecting impurities than AES, several thousand ppm of C, F and O were found to be intermingled as impurities in the Cu thin film.

Moreover, the electric resistivity of the Cu thin film was found to be 2.0 $\mu\Omega$·cm, which is 10% higher as compared with that of Cu bulk. As clear from above explanation, it is still difficult according to the conventional CVD technique to form a Cu film of high purity and low electric resistance.

By the way, as explained above, Cu metal for use as a wiring is to be formed on a barrier layer, the surface of which is generally covered with a natural oxide film. In the method of forming a copper layer by way of a thermal CVD method using the aforementioned Cu complex compound, the decomposition of the Cu complex compound hardly takes place on the surface of the underlying layer if the surface of the underlying layer is formed of an insulating material. Therefore, the generation of Cu nucleus in the initial stage of the deposition of Cu takes place in a lesser degree on the surface of the underlying layer covered with the natural oxide layer as compared with that on the surface of a metal not covered with the natural oxide film. As a result, the density of Cu nucleus in the initial stage of the Cu deposit ion is lowered as compared with the case where the deposition of Cu is performed by other means such as the PVD method, and at the same time the amount of Cu required for the Cu nuclei thus deposited becomes a continuous layer would be correspondingly increased.

Namely, the CVD method is inherently accompanied with a drawback that it is rather difficult to form a thin continuous film as compared with the PVD method. Because of the same reason, the CVD method is accompanied with a serious problem that the surface features of Cu thin film deposited through the CVD method is much poor as compared with those to be obtained by the PVD method. Because of these problems, it is very difficult to employ the CVD method as a means for depositing Cu for forming a fine inter-connecting wiring in spite of its advantages such as the excellent step-coverage property etc.

There has been also proposed the following method for solving the aforementioned problems thereby to obtain a Cu thin film excellent in smoothness. According to this method, a metallic film free from an oxide surface layer is prepared as an underlayer for depositing a Cu layer as disclosed in the aforementioned article by S. K. Reynolds. According to this method, a Ta thin film as a barrier layer is deposited at first, and the oxide layer on the surface of the Ta layer is etched away by means of sputtering using Ar ions immediately before the deposition of Cu that will be performed by means of a CVD method under the conditions inhibiting the re-oxidation of the Ta surface. According to this method, the density of Cu nuclei to be generated on the surface of the underlying layer during the CVD process is increased thereby allowing a Cu thin film 250 nm in thickness for example and excellent in smoothness to be obtained.

There is also proposed another method wherein sputter-etching is not employed as described in an article by N.Awaya (VMIC conference, p254 (1991)). According to this method, a thin film of Cu is deposited by way of sputtering on a barrier layer to form an underlying Cu film, which is subsequently exposed to a hydrogen reducing atmosphere to reduce the Cu oxide layer formed on the surface of the underlying Cu film, thus increasing the density of Cu nuclei to be generated on the surface of the underlying Cu film during the CVD process thereby allowing a Cu thin film excellent in smoothness to be obtained.

According to these methods, however, in order to assure the smoothness of a Cu thin film to be formed by means of a CVD method, a sputtering step for pretreating the underlying layer or for depositing an underlying layer is required in addition to the CVD step, thus complicating the manufacturing steps. Moreover, when the features of underlying layer include a fine trench for forming a buried interconnecting wiring or a fine hole (a via hole) for achieving an electric connection between the layers of a multilayer wiring, the employment of aforementioned methods making use of a sputtering phenomenon may give rise to various problems. For example, it is difficult to uniformly remove a layer from or uniformly deposit a layer on the side wall or bottom of a trench or hole of high aspect ratio by way of sputtering. As a result, even if it is possible to form a smooth Cu thin film on a flat underlying layer by making use of the CVD method, the smoothness of the Cu thin film deposited may be deteriorated in the trench or hole of high aspect ratio, or voids may be kept remained in the trench or hole.

Meanwhile, the effects of adding water ($H_2O$) or oxygen ($O_2$) to a source gas in the Cu-CVD method are described in the following articles. Namely, in an article (MRS BULLETIN, vol.xix, No. 8, pp. 49–54 (1994)) by A. V. Gelatos et al, the addition of $H_2O$ to a CVD source gas comprising (Hfac)Cu(tmvs) is described, alleging that a trench about 3 in aspect ratio can be effectively buried with an excellent step-coverage. It is assumed that the addition of $H_2O$ is effective in increasing the density of Cu hucleation in the course of depositing Cu. However, since a Cu oxide may be formed unless the CVD is performed in a reducing region by sufficiently minimizing the $H_2O$ partial pressure, there is a problem that the electric resistance of the resultant Cu film may be increased by four times as that of Cu film which is formed without the addition of $H_2O$.

On the other hand, in an article (J.Appl.Phys., vol.73, pp. 5213–5215 (1993)) by Z.Hammadi et al, the addition of $O_2$ to a CVD source gas comprising $Cu(acac)_2$ is described, alleging that if $O_2$ is not continuously supplied to the source gas during the step of CVD, the deposition of Cu thin film on a P-doped silicon substrate can not be achieved. However, the electric resistance of the resultant Cu film at room temperature is twice as high as that of a Cu film formed through a physical evaporation, though the electric resistance of the resultant Cu film just like the conductivity thereof also depends on temperature, thus failing to realize the advantage of Cu wiring that the Cu wiring is inherently low in resistivity as compared with Al wiring.

As explained above, in the manufacture of a semiconductor device provided with a metallic thin film such as an interconnecting wiring or electrodes, a copper thin film formed by way of a CVD method is poor in adhesion to an underlying barrier layer, even though the copper thin film formed by way of a CVD method is superior in step-coverage and more suited for forming a fine copper wiring as compared with that formed by way of a PVD method. On the other hand, the conventional methods employed for solving the above problems give rise to new problems that the enlargement or complication of manufacturing apparatus may be caused, or an increase in electric resistance of the wiring may be resulted.

On the other hand, when a natural oxide film is present on the surface of a barrier layer constituting an underlying layer before depositing a Cu layer, the surface smoothness of the Cu layer deposited would become poor. According to the conventional methods adopted for solving the above problems, new problems that the process of forming an interconnecting wiring may become complicated would be raised due to an additional manufacturing step such as a step of removing the natural oxide film or a step of superimposing a thin film which is free from the natural oxidation on the surface of the barrier layer.

On the other hand, according to the conventional method of feeding a source gas together with $H_2O$ or $O_2$, the electric resistance of the resultant Cu thin film would be increased so that the advantage of Cu thin film as a material for a low resistance interconnecting wiring would be lost.

In the above explanation, various problems in the manufacturing process of Cu thin film by way of the CVD method have been discussed. However, there are also various problems on the CVD apparatus to be used for carrying out such a CVD method. First of all, it should be noted that a monovalent copper compound represented by the aforementioned (hfac)Cu$^{+1}$(tmvs) is excellent as a CVD source gas in the following respects. Namely, the Cu compound has such a suitable degree of vapor pressure as required for the CVD source gas and is capable of forming a deposition of Cu film at a low temperature of 200° C. or less, which is comparatively excellent in surface smoothness.

According to an article by J. A. T. Norman et al (Journal de Physique C2 (1991) pp271–278), the (hfac)Cu$^{+1}$(tmvs) is known to set forth the following reaction on the surface of a substrate to precipitate Cu atoms.

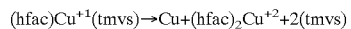

wherein (hfac)$_2$Cu$^{+2}$ is bivalent copper compound which is a green solid at room temperature.

By the way, since the decomposition reaction of the (hfac)Cu$^{+1}$(tmvs) proceeds even at a low temperature of as low as 160° C., this Cu compound is advantageous in that it is possible to perform the deposition of Cu on a surface of substrate at a low temperature as mentioned above. However, there is a problem in the use of this Cu compound that the deposition of Cu may tend to occur even at a peripheral portion around the substrate that has been heated. For example, since the peripheral portion around a heater disposed for heating a wafer is also heated to the same degree as that of the wafer, the deposition of Cu occurs also at this peripheral portion. As the deposition of Cu on the wafer is repeated, the amount of Cu deposited outside the surface of the wafer is accumulated thus increasing the thickness of the Cu deposition and ultimately resulting in the peel off of the deposited Cu film. The Cu film peeled off in this manner may cause the contamination of the surface of the wafer.

In particular, a holding ring which is mounted to cover the outer peripheral portion of a wafer for the purpose of holding the wafer or preventing the back surface of the wafer from being deposited with Cu is most susceptible to the Cu deposition during the CVD treatment, since the holding ring is directly contacted with the wafer. Moreover, since this holding ring is generally made of an insulating material such as quartz glass, the CVD-Cu film thus deposited is more likely to be peeled off, thus raising a problem. It is a well known fact that a CVD-Cu film deposited on an insulative substrate is poor in adhesion and can be easily stripped away. Therefore, it is required to suspend the operation of a CVD apparatus before this deposited film is peeled off and to wash away this superfluous Cu film. However, such a cleaning operation extremely deteriorates the operation rate of the CVD apparatus thus badly affecting the productivity of semiconductor device.

There is another problem of the segregation of a reaction product, i.e. $(hfac)_2Cu^{+2}$ from the reaction of the source gas mentioned above. As disclosed in an article by Scott K. Reynolds et al (Appl.Phys.Lett. 59 pp. 2332–2334 (1991)), since the $(hfac)_2Cu^{+2}$ has a vapor pressure of about 1 Torr at a temperature of 80° C. and thermally stable as compared with (Hfac)Cu(tmvs) i.e. hardly decomposable during the low temperature CVD step as mentioned above, the segregation and aggregation of the reaction product on the surface of wafer or on the surface of the circumferential region around wafer would not be brought about.

However, if there is existed a cool surface which has been cooled down to room temperature or lower, for example a piping disposed between a CVD reaction chamber and a vacuum pump for exhausting a source gas, the segregation of the reaction product may be caused on the surface of the piping, thus precipitating solid-state $(hfac)_2Cu^{+2}$ microcrystals. The presence of $(hfac)_2Cu^{+2}$ microcrystals may become a cause of contaminating the wafer surface or giving a damage to the precision machine parts of the vacuum pump. Therefore, a periodical cleaning of the apparatus is required for removing the $(hfac)_2Cu^{+2}$ precipitated in this manner. However, such a cleaning operation extremely deteriorates the operation rate of the CVD apparatus thus badly affecting the productivity of semiconductor device.

As for the removal of the $(hfac)_2Cu^{+2}$, there is disclosed a method in an article by A.Jain et al (J.Electrochem.Soc.140 (1993) pp. 1434–1439) wherein a trap cooled with a liquid nitrogen is disposed between a CVD reaction chamber and a vacuum pump to deliberately allow reaction products such as $(hfac)_2Cu^{+2}$ to be adsorbed on the surface of the trap. With this method, it is possible to prevent the solid $(hfac)_2Cu^{+2}$ from entering into the pump. However, according to this method, a periodical exchange or cleaning of the trap is required, thus badly affecting the productivity of semiconductor device as in the case of the previous methods.

As explained above, in the manufacture of a semiconductor device provided with a metallic thin film such as an interconnecting wiring or electrodes, a copper thin film may be undesirably deposited on any heated portion of a CVD reaction chamber thus giving rise to the generation of dust resulting from the peeling of the copper thin film, even though the copper thin film formed by way of a CVD method is superior in step-coverage and more suited for forming a fine copper wiring as compared with that formed by way of a PVD method. On the other hand, the conventional methods employed for solving the above problems give rise to new problems that a periodical cleaning of the interior of the CVD apparatus is required, thus badly affecting the productivity of semiconductor device.

On the other hand, in the employment of a monovalent copper compound having an excellent property as a CVD source gas, reaction products may be segregate inside a vacuum pump thus giving rise to the cause of damage of the vacuum pump. Meanwhile, according to the conventional method employed for solving the above problem wherein a cooling trap is disposed between a CVD reaction chamber and a vacuum pump to trap and remove reaction products, a periodical exchange or cleaning of the trap is required, thus giving a new problem that the productivity of semiconductor device is badly affected.

When the CVD technique which is excellent in film-forming property as explained above is to be industrially utilized in the manufacture of a semiconductor device for example, the stabilization in supply of a source gas is considered to be required so as to attain the stability of the film-forming step. In the CVD method using a liquid source, the following method of supplying the source to the CVD reaction chamber has been conventionally adopted. Namely, a vessel filled with a liquid source is heated so as to increase the vapor pressure of the source gas to evaporate it, and at the same time the source gas is bubbled with an inert gas such as Ar thereby accelerating the evaporation of the source gas. The source gas accompanying the inert gas is then supplied to the CVD reaction chamber (a bubbling method).

According to another conventional method, a micropump or a liquid mass flow controller which is capable of delivering a predetermined amount of liquid is combined with an vaporizer capable of evaporating the liquid thus delivered, the resultant source gas being supplied to a CVD reaction chamber (a liquid delivering method). One example of this liquid delivering method as applied to the CVD processing of Cu is described in an article by A. E. Kaloyeros et at (MRS BULLETIN/JUNE 1993 pp.22–29 (1993)).

However, according to the bubbling method, since the liquid source is heated to raise the vapor pressure of the source gas, the compound in the source is liable to be thermally decomposed or polymerized in a bubbling vessel, so that the vapor pressure may be fluctuated or the compound may be changed into a different compound which is undesirable for use as a CVD source. Moreover, the employment of a compound having a low vapor pressure may bring about a problem that the supply of a large amount of source gas may become difficult.

On the other hand, the aforementioned liquid delivering method is advantageous in that a large amount of source gas can be delivered or supplied as compared with the bubbling method, and the source can be kept at room temperature until it is actually supplied to an vaporizer so that the denaturing of the source can be prevented. However, since an on-off valve and the like which is mounted for delivering liquid to a heated vaporizer is also heated, the source may be denatured at this on-off valve, resulting in the clogging of this on-off valve of low conductance or in the malfunctioning of the on-off valve.

SUMMARY OF THE INVENTION

Accordingly, an object of the present invention is to provide a method of manufacturing a semiconductor device which can be carried out without inviting an enlargement or complication of a manufacturing apparatus, and in which a copper thin film of very high purity can be deposited on an underlying layer by way of a CVD method, achieving an excellent adhesion with the underlying layer without substantially inviting an increase in resistance of an interconnecting wiring to be formed from the copper thin film.

Another object of this invention is to provide a chemical vapor deposition apparatus which is capable of improving the operation rate of apparatus by preventing a Cu film deposited unintentionally on a heated portion of the apparatus from being peeled off thereby to prevent a wafer from being contaminated by the dust of the Cu film, and by minimizing the frequency of cleaning operation of the interior of the apparatus.

Another object of this invention is to provide a chemical vapor deposition apparatus which is capable of delivering, while assuring an excellent controllability and stability, a large amount of source gas to a CVD reaction chamber without causing the denaturing of the source gas in a storage tank or without causing the clogging an on-off valve mounted at the inlet port of an vaporizer with decomposed materials.

Namely, according to the present invention, there is provided a method of manufacturing a semiconductor device comprising the steps of forming an intermediate thin film which is either one of a diffusion-preventing thin film or a glue thin film on a substrate; performing a first vapor deposition by supplying a source gas comprising a copper-containing organometallic compound and an oxidizing gas over the intermediate thin film thereby to allow a first conductive thin film containing copper as a main component and a trace of oxygen to be grown through a chemical vapor deposition; and performing a second vapor deposition by supplying the source gas without supplying the oxidizing gas thereby to allow second conductive thin film mainly containing copper to be grown through a chemical vapor deposition.

According to the present invention, there is further provided a method of manufacturing a semiconductor device comprising the steps of forming an intermediate thin film which is either one of a diffusion-preventing thin film or a glue thin film on a substrate; performing a first vapor deposition by supplying a source gas comprising a copper-containing organometallic compound and an oxidizing gas over the intermediate thin film thereby to allow a first conductive thin film containing copper as a main component and a trace of oxygen to be grown through a chemical vapor deposition; performing a second vapor deposition by supplying the source gas without supplying the oxidizing gas thereby to allow a second conductive thin film mainly containing copper to be grown through a chemical vapor deposition; and heat-treating the first and second conductive thin films at a temperature which is higher than those employed in the first and second vapor depositions.

According to the present invention, there is further provided a chemical vapor deposition apparatus comprising a chemical vapor reaction chamber for housing a substrate on a surface of which a thin film is to be deposited; an evaporation chamber connected with the chemical vapor reaction chamber for evaporating a liquid organometallic compound; and a source-supplying means for supplying the liquid organometallic compound from a raw material storage chamber to the evaporation chamber; the evaporation chamber being provided with an evaporating surface as an evaporating means with which the liquid organometallic compound is evaporated as the liquid organometallic compound flows down on the evaporating surface.

Furthermore, according to the present invention, there is further provided a chemical vapor deposition apparatus comprising a chemical vapor reaction chamber for housing a substrate on a surface of which a thin film is to be deposited; an evaporation chamber connected with the chemical vapor reaction chamber for evaporating a liquid organometallic compound; and a source-supplying means for supplying the liquid organometallic compound from a source storage chamber to the evaporation chamber; the source-supplying means being provided with a rotatable cylindrical revolver, a cylinder disposed within the cylindrical revolver in parallel with and displaced from the axis of the cylindrical revolver and provided with an inlet port opening at one end face of the cylindrical revolver and an outlet port opening at the other end face of the cylindrical revolver, means for rotating the cylindrical revolver, a liquid source-supplying means whose outlet port is disposed at a first location on the one end face of the cylindrical revolver for supplying a liquid organometallic compound from the source storage chamber, a high pressure gas-supplying means whose outlet port is disposed at a second location on the one end face of the cylindrical revolver, a liquid source injection nozzle whose inlet port is disposed at a location of the the other end face of cylindrical revolver which corresponds with the second location, and means for injecting the liquid raw material via the liquid source injection nozzle by supplying the liquid organometallic compound to the cylinder by actuating the liquid source-supplying means when the inlet port of the cylinder is positioned at the first location as the cylinder is turned by the rotating means, and by supplying the high pressure gas to the cylinder by actuating the high pressure gas-supplying means when the inlet port of the cylinder is positioned at the second location as the cylinder is turned by the rotating means.

Moreover, according to the present invention, there is further provided a chemical vapor deposition apparatus comprising a chemical vapor reaction chamber for housing a substrate on a surface of which a thin film is to be deposited; an evaporation chamber connected with the chemical vapor reaction chamber for evaporating a liquid organometallic compound; and a source-supplying means for supplying the liquid organometallic compound from a source storage chamber to the evaporation chamber; the chemical vapor reaction chamber being constructed such that at least part of the surface thereof which is to be exposed to the source gas from the evaporation chamber is covered with copper or a copper oxide.

According to the present invention, there is further provided a chemical vapor deposition apparatus comprising: a chemical vapor reaction chamber for housing a substrate on a surface of which a thin film is to be deposited; an evacuating means connected to the chemical vapor reaction chamber for evacuating the chemical vapor reaction chamber; a source-supplying means for supplying a liquid organometallic compound to the chemical vapor reaction chamber; and a reaction-product-removing device inner surface of which is covered with copper or copper compound, and which is arranged between the chemical vapor reaction chamber and the evacuating means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A and 2B are graphs showing respectively results of SIMS analysis of the impurity concentration in thickness-wise of Cu films of samples in Example and Comparative Example;

FIG. 6 is a sectional view schematically showing a chemical vapor deposition apparatus of this invention;

FIGS. 8A to 8C are sectional views illustrating a CVD source-supplying apparatus to be used in a chemical vapor deposition apparatus of this invention;

FIG. 13 is a graph showing a relationship between the film thickness of Cu deposited and the number of injection of a source gas;

FIG. 15 is a perspective view schematically illustrating a reactor structure where a plurality of reaction surfaces, each having a cone-shaped surface, are superimposed one another;

FIG. 16 is a perspective view schematically illustrating a reactor structure where reaction surfaces are formed in a porous body;

FIGS. 17A to 17C are sectional views, each schematically showing a wafer-holding ring to be used in a chemical vapor deposition apparatus according to another embodiment of this invention;

DETAILED DESCRIPTION OF THE PREFERRED EMBODIMENTS

Figure 1A:
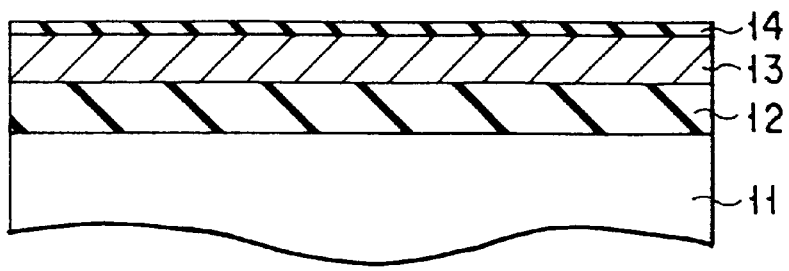
FIGS. 1A to 1C are sectional views illustrating the manufacturing steps of a semiconductor device according to a first embodiment of this invention.

The method of forming a thin film containing as a main component copper on a substrate by means of chemical vapor deposition method according to this invention is featured in that a source gas comprising a copper-containing organometallic compound and an oxidizing gas are introduced over the substrate at first, and then only the source gas is continued to supply thereon suspending the supply of the oxidizing gas thereby allowing a thin film mainly containing copper to be grown on the substrate. Further, the method of this invention is featured that the resultant thin film is subsequently heat-treated at a temperature higher than that employed in the chemical vapor deposition.

The followings are preferred embodiments in the method of this invention.

(1) As a diffusion-preventing thin film, refractory metals such as Nb, Ta, Ti and W; nitrides of refractory metals such as TiN, WN; silicides of refractory metals such as $TaSi_2$; and a ternary alloy comprising a refractory metal, Si and N are used.

(2) As an oxidizing gas, $O_2$, $O_3$, or $H_2O$ is used.

(3) The temperature of the substrate at the time of growing a copper thin film is set to 200° C. or lower.

(4) As an organic copper compound constituting a source gas, an organometallic compound having a molecular structure having Lewis group linked via oxygen atom to copper atom is employed. Specifically, β-diketonate compound such as (Hfac)Cu(tmvs); {[(CF$_3$CO)$_2$CH]Cu(C$_5$H$_{12}$Si): hexafluoroacetylacetonate trimethylvinylsilane copper} is employed as an organic copper compound.

(5) An oxidizing gas such as $O_2$ is supplied to a CVD reaction chamber together with a source gas for a predetermined period of time from the beginning of the deposition, and then the supply of the oxidizing gas is stopped and only the source gas is supplied (the oxidizing gas is not supplied) for performing the thermal CVD thereof until the film thickness of Cu film is increased to a predetermined value. In this occasion, it is possible to employ a carrier gas for bubbling or transporting the source gas.

(6) Upon finishing the deposition of the Cu film, the Cu film is subjected to a heat treatment in vacuum or in a reducing atmosphere such as $H_2$ gas at a temperature suited for forming a CVD film, preferably 300° C. or more, more preferably 300 to 500° C.

(7) Cu is buried in a trench formed in an insulating film by making use of the Cu deposition method of this invention, and then superfluous Cu deposited outside the trench is removed by means of chemical-mechanical polishing or mechanical polishing to obtain a buried Cu wiring or electrode. Alternatively, Cu is buried in a hole formed in an insulating film by making use of the Cu deposition method of this invention, and then superfluous Cu deposited outside the hole is removed by means of chemical-mechanical polishing or mechanical polishing to obtain a via plug or a contact plug.

(8) The supply of oxidizing gas to the CVD reaction chamber is controlled in such a manner that the partial pressure ratio between the oxidizing gas and the copper source gas becomes not more than 2, or that the ratio in supply flow rate between the oxidizing gas and the copper source gas becomes not more than 2, preferably 0.1 to 2.

(9) By means of a CVD method where the copper source gas is supplied together with the oxidizing gas, a copper thin film containing a trace of oxygen is deposited on an underlying substrate, and then by means of a CVD method where only the copper source gas is supplied, a copper thin film not containing oxygen is deposited thereon, thereby forming a stack structure consisting of a copper thin film containing a trace of oxygen and a copper thin film not containing oxygen. More preferably, the concentration of oxygen in the oxygen-containing copper thin film is 1 atomic % or less based on the copper atoms.

(10) The film thickness of the copper thin film containing a trace of oxygen is so thin that it can be barely recognized as a continuous film, e.g. 100 to 500 angstroms.

According to the method of this invention, the CVD source gas is supplied together with the oxidizing gas in the initial stage of depositing Cu by means of a CVD method, and the deposited Cu film is subjected to a heat treatment under a reduced pressure at a temperature higher than that employed in carrying out the deposition. With this method, it is possible to improve the adhesion between the underlying diffusion-preventing thin film and the Cu thin film and to form a buried Cu wiring by means of polishing. Moreover, due to the introduction of $O_2$ at the initial stage of the deposition, it is possible to inhibit the impurities originating from the elements in the source gas from intermingling into the resultant Cu thin film, thus making it possible to form a Cu wiring of high purity and low electric resistance.

Now, the functions of this invention will be explained in more detail.

This invention provides a method for forming a Cu thin film by means of a thermal CVD method on a substrate covered with a diffusion-preventing thin film or glue layer having a natural oxide film formed thereon which is characterized in that the adhesion between the substrate and the Cu thin film is improved, and a Cu thin film of high purity and low resistivity can be formed for forming a fine wiring or an electrode.

Specifically, according to this invention, a diffusion-preventing thin film or glue layer is deposited on an insulating film such as $SiO_2$ film at first. As a material for this diffusion-preventing thin film, a refractory metal or a compound thereof which is known to be generally effective to prevent the diffusion of Cu at a high temperature up to 600° C. can be employed. For example, a refractory metal such as Nb, Ta and W; nitrides of refractory metals such as TIN, WN; suicides of refractory metals such as $TaSi_2$; and a ternary alloy comprising a refractory metal, Si and N can be used.

Upon finishing the deposition of this diffusion-preventing thin film, the substrate is transferred to a thermal CVD reaction chamber for performing the deposition of Cu thin film. During this transfer of the substrate, the surface of the diffusion-preventing thin film is generally exposed to air atmosphere in the clean room and oxidized forming a natural oxide film consisting of a very thin film of a refractory metal oxide. The substrate thus treated is mounted in a thermal CVD reaction chamber and heated to a predetermined temperature. It is preferable in this case to control the temperature of the substrate to 200° C. or lower in view of depositing a Cu thin film excellent in surface smoothness.

The deposition of Cu is initiated by introducing an organic copper compound into a CVD reaction chamber mounted therein with the substrate and evacuated in advance. In this case, an oxidizing gas such as $O_2$ gas is introduced into the CVD reaction chamber concurrently with the feeding of an organic copper compound gas, which is one of the features of this invention. The supply flow rate of $O_2$ gas can be kept constant by means of a mass flow controller.

As an organic copper compound constituting a source gas, an organometallic compound having a molecular structure having Lewis group linked via oxygen atom to copper atom such as β-diketonate copper (1) compound (herein (1) indicates that the Cu is monovalent) can be employed. The organic copper compound of this kind is capable of exhibiting a relatively high vapor pressure at a low temperature of about 50° C. and of allowing the deposition of Cu to occur at the aforementioned temperature of the substrate. Moreover, because of its specific molecular structure where Lewis group is linked via oxygen atom to copper atom, it would be possible that the introduction of $O_2$ gas as mentioned above enable to obtain the deposition of a high purity Cu film as explained in the Examples set forth hereinafter. Specific examples of such a compound are β-diketonate copper (1) olefin compound such as (Hfac)Cu(tmvs); $\{[(CF_3CO)2CH]Cu(C_5H_{12}Si)$: hexafluoroacetylacetonate trimethylvinylsilane copper$\}$ and β-diketonate copper (1) alkyne compound such as (Hfac)Cu(tmsa); $\{[(CF_3CO)_2CH]Cu(C_5H_{10}Si)$: hexafluoroacetylacetonate trimethylsilaneacetylene copper$\}$. The organic copper compound can be evaporated by heating it at a temperature lower than the decomposition temperature thereof, the resultant organic copper compound gas thus evaporated is then introduced into the CVD reaction chamber. In this occasion, it is possible to employ a carrier gas for bubbling or transporting the source gas.

The $O_2$ gas should be supplied to the CVD reaction chamber through a separate pipe from that of the source gas. If the $O_2$ gas is supplied through a common pipe together with the source gas, an undesirable phenomenon will be brought about. For example, when the organic copper compound is bubbled by the $O_2$ gas, a reaction will be caused between the liquid or solid organic copper compound and the $O_2$ gas, resulting in the lowering of vapor pressure of the organic copper compound.

The time period required for depositing Cu is determined by the time period of supplying the source gas. However, it is desirable that the time period in which the source gas is supplied together with the $O_2$ gas is also part of the time period for depositing Cu. Namely, the $O_2$ gas is supplied to a CVD reaction chamber together with a source gas for a predetermined period of time from the start of the deposition, and then the supply of the oxidizing gas is suspended and only the source gas is supplied (the oxidizing gas is not supplied) for performing the thermal CVD thereof until the film thickness of Cu film is increased to a predetermined value. Thus, the $O_2$ gas is supplied only during the initial stage of the Cu deposition. The supply of the $O_2$ gas is effective in improving the adhesion between the underlying layer and Cu film and in minimizing the incorporation of impurities into the resultant Cu film as will be explained below. However, the deposition rate of Cu is decreased by the concurrent supply of the $O_2$ gas as compared with that where only the source gas is supplied. Therefore, the reason for limiting the supply of the $O_2$ gas to the initial stage of the Cu deposition is to improve the adhesion and purity of the resultant Cu thin film without excessively prolonging the deposition time period.

The supply flow rate of $O_2$ gas at the initial stage of the Cu deposition should be controlled to a prescribed range in relative to the supply flow rate of the source gas. Namely, when the partial pressure of the source gas is expressed as Ps and the partial pressure of the $O_2$ gas is expressed as Po, the ratio between the supply flow rate of the source gas and the supply flow rate of the $O_2$ gas should preferably be controlled to (Po/Ps) <2. In other words, when the supply flow rate of the source gas is expressed as Js and the supply flow rate of the $O_2$ gas is expressed as Jo, the ratio between the supply flow rate of the source gas and the supply flow rate of the $O_2$ gas should preferably be controlled to (Jo/Js) <2. The reason for limiting the ratio of these supply flow rates is as follows. Namely, it is possible under such conditions of supply flow rate as mentioned above to deposit a high purity Cu film whose impurity concentration can be reduced to $\frac{1}{100}$ or less as compared with that in a Cu film to be obtained using the conventional CVD method.

The mechanism as to why the inclusion of impurities can be extremely reduced by the addition of $O_2$ in the method of Cu-CVD according to this invention is not yet made clear. However, it is assumed that the elements that can be mixed as an impurity into the Cu film are restricted to C, F and O when (Hfac)Cu(tmvs) is employed as a source gas, and Si which is included in the (tmvs) group can not be detected in the resultant Cu film. Therefore, it is assumed that the impurities contaminating the resultant Cu film come from the (Hfac) group or a decomposed product of (Hfac)Cu group.

In the initial stage of forming Cu film by means of CVD, the source gas is caused to decompose on the surface of a diffusion-preventing thin film such as TiN film, causing the resultant (Hfac) group or (Hfac)Cu group to adsorb onto the surface of the diffusion-preventing thin film. These (Hfac) group or (Hfac)Cu group thus adsorbed is further caused to decompose into compounds of smaller molecular weight such as $CF_3$, allowing these compounds of smaller molecular weight to be entrapped as impurities in the growing Cu film. If the deposition of Cu film is further continued to proceed on this Cu film contaminated with impurities by means of the CVD method, the inclusion of the impurities would be continued according to the same mechanism as explained above, thus deteriorating the purity of the resultant Cu film.

Once thus high purity Cu is deposited, even if CVD using only source gas is performed, inclusion of impurities into thus formed Cu film can be made extremely minimize.

Meanwhile, according to the method of this invention where $O_2$ gas is concurrently fed at the initial stage of the deposition of Cu film, the generation of these decomposed products constituting a source of impurities are inhibited, or these decomposed products are immediately desorb from the surface of Cu film being grown even if they are generated, thus making it possible to extremely minimize the inclusion of impurities as compared with the conventional CVD method.

Another feature of this invention resides in that after the completion of Cu deposition by way of the CVD method, the resultant Cu film is subjected to heat treatment at a temperature higher than that used in the deposition of Cu. The temperature of this heat treatment should preferably be 300° C. or more in view of improving the adhesion of the Cu film. The atmosphere for this heat treatment should preferably be vacuum or $H_2$ atmosphere of reduced pressure in view of preventing the oxidation of Cu film during the heat treatment.

In the followings, the method of forming a buried fine Cu wiring according to this invention will be explained.

Cu is buried in a trench formed in an insulating layer according to the Cu deposition method of this invention. In this case, the inner wall surface of the trench is deposited in advance with a diffusion-preventing thin film before the Cu deposition is performed. The Cu deposition is continued until the trench is completely filled. As explained above, the Cu deposition is performed by feeding $O_2$ gas together with an organic copper compound (a source gas) to the CVD reaction chamber in the initial stage of the Cu deposition.

The supply flow rate of $O_2$ gas to be fed concurrently as mentioned above should be controlled to a prescribed range in relative to the supply flow rate of the source gas. Namely, when the partial pressure of the source gas is expressed as Ps and the partial pressure of the $O_2$ gas is expressed as Po, the ratio between the supply flow rate of the source gas and the supply flow rate of the $O_2$ gas should preferably be controlled to (Po/Ps) <2. In other words, when the supply flow rate of the source gas is expressed as Js and the supply flow rate of the $O_2$ gas is expressed as Jo, the ratio between the supply flow rate of the source gas and the supply flow rate of the $O_2$ gas should preferably be controlled to (Jo/Js) <2. As a result, it is possible to deposit a high purity Cu film containing only a very little amount of impurities.

After Cu is buried in the trench by way of the CVD method, the resultant Cu film is subjected to heat treatment at a temperature higher than that used in the deposition of Cu in order to improve the adhesion between the Cu film and the underlying diffusion-preventing layer. This heat treatment should preferably be performed in vacuo or in an $H_2$ atmosphere of reduced pressure in view of preventing the oxidation of Cu film during the heat treatment.

Then, any superfluous Cu deposited outside the trench is removed by means of chemical-mechanical polishing or mechanical polishing to obtain a buried Cu wiring or electrode. With the employments of the CVD accompanying the addition of $O_2$ and the heat treatment as explained above, it is possible to obtain such an excellent adhesion between the Cu film and the underlying diffusion-preventing thin film that the Cu film thus obtained would never be stripped away during the aforementioned polishing step. As a result, it is possible to attain an excellent Cu-buried wiring and Cu-buried electrode.

On the contrary, if the Cu film which is deposited by using the CVD method accompanying the concurrent supply of $O_2$ is not subsequently heat-treated, or if the Cu film which is deposited without using the CVD method accompanying the concurrent supply of $O_2$ at the initial stage of the Cu deposition is subsequently heat-treated, the Cu film would most likely be stripped off during the polishing step. Thus, it should be noted that both of the CVD method accompanying the concurrent supply of $O_2$ at the initial stage of the Cu deposition and the subsequent heat treatment are absolutely necessary for improving the adhesion of the Cu film.

The method of this invention is not restricted to the formation of a buried wiring or electrode, but may be applicable to the formation of a Cu contact plug for electrically connecting an active layer of a semiconductor device and an interconnecting wiring, and also to the formation of a Cu via plug for achieving an electric connection between wiring layers in a semiconductor device having a multilayer wiring structure. Moreover, the working of the Cu film for forming a wiring according to this invention is not restricted to a polishing method, but a dry etching method can be employed in place of the polishing method to obtain a Cu thin film of excellent adhesivity.

The reason as to why the employments of both of the CVD method accompanying the concurrent supply of $O_2$ at the initial stage of the Cu deposition and the subsequent heat treatment are effective in improving the adhesion of the Cu film is not yet made clear. However, it is assumed that when $O_2$ gas is supplied at the initial stage of the Cu deposition, a Cu film containing a trace quantity of oxygen is formed at the interface between the underlying layer and the Cu thin film. This oxygen-containing Cu film is assumed to be excellent in adhesion with a natural oxide film formed on the surface of the diffusion-preventing thin film. Moreover, it is considered that when the heat treatment is performed after the deposition of Cu, an inter-diffusion takes place between the oxygen-containing Cu film and the underlying natural oxide film to further improve the adhesion between these oxide layers. However, even if the interface between the oxygen-containing Cu film and the underlying natural oxide film was observed by SEM after the heat treatment, the formation of aforementioned interdiffusion layer was not confirmed. As a matter of fact however, a prominent improvement of adhesion as a result of the $O_2$ supply and the heat treatment has been actually confirmed through experiments by the present inventors.

The method of depositing Cu according to this invention has been explained taking a thermal CVD method as an example, but it is also possible to employ other kinds of CVD methods such as a plasma CVD method or an optical CVD method.

In the above description, various diffusion preventing thin films are explained as an example of the substrate on which Cu is deposited according to this invention. When, however, the interlayer insulating film has a diffusion preventing ability, a metal thin film for promoting a nuclear generation of Cu or glue thin film can be used in stead of the diffusion preventing thin film.

In the present invention, a small amount of alloying metal elements such as Sn, Co, and Te can be added to Cu. It is known that these metal elements improve a resistance to electromigration or stress migration. In this case, during the second Cu deposition step without introduction of oxidizing gas, organometallic compound gas containing the alloying metal is supplied together with organic copper compound gas, thus forming alloy containing Cu as a main component.

This invention will be explained further with reference to the following various examples.

EXAMPLE 1

Figure 1B:
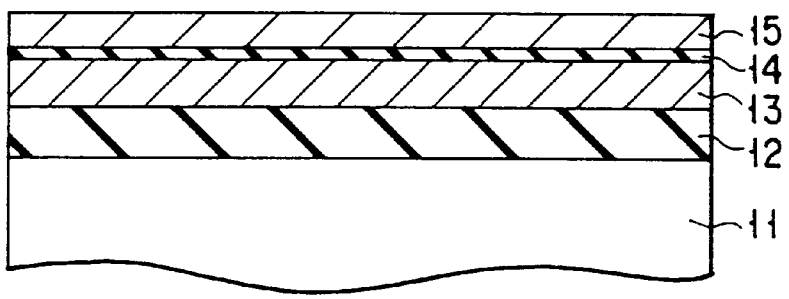
Figure 1C:
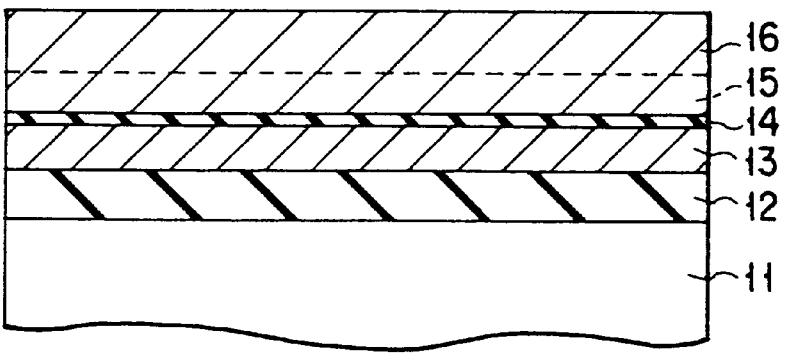

FIGS. 1A to 1C are sectional views illustrating the manufacturing steps of a semiconductor device according to a first embodiment of this invention, which illustrates one example of depositing a Cu thin film excellent in adhesion on a TiN layer.

As shown in FIG. 1A, a substrate comprising a silicon wafer 11 on which a silicon oxide film 12 having a thickness of 100 nm was formed was employed for depositing Cu. Then, a TiN thin film 13 as a Cu diffusion-preventing layer was formed by way of sputtering on this substrate to a thickness of 90 nm. This substrate provided with the TiN film was once exposed to air atmosphere in order to transfer the substrate to another film-forming apparatus for depositing Cu. As a result of this exposure, a natural oxide film 14 consisting of a Ti oxide was formed on the surface of the TiN thin film 13 constituting the uppermost surface of the substrate.

Then, this substrate was mounted in a reaction chamber of a thermal CVD apparatus, and a Cu thin film was deposited on the substrate by way of a thermal CVD method after the interior of the reaction chamber was exhausted to a vacuum degree of $1\times10^{-4}$ Pa. In this case, as a source gas, hexafluoroacetylacetonate trimethylvinylsilane copper {(Hfac) Cu (tmvs)} was employed. The molecular formula of this compound is $[(CF_3CO)_2CH]Cu(C_5H_{12}Si)$. By thermally evaporating this compound, the Cu source gas was introduced over the substrate heated to 200° C., and at the same time $O_2$ gas was introduced over the substrate through a piping which was disposed in separate from the piping for the Cu source gas, thereby carrying out a thermal CVD method under a reduced pressure.

During this film-forming process, the partial pressure of the source gas was about 0.3 Torr and the partial pressure of the $O_2$ gas was about 0.08 Torr. Any carrier gas was not employed in this supply of the source gas. The control in pressure of the reaction chamber during the CVD was performed by adjusting the opening ratio of a conductance variable valve disposed between the reaction chamber and a vacuum pump.

More specifically, the source gas and $O_2$ gas were concurrently supplied for 30 seconds to form a Cu film 15 as shown in FIG. 1B. Then, the supply of the $O_2$ gas was suspended and the thermal CVD was continued further for 90 seconds by supplying only the source gas to form a Cu film 16 as shown in FIG. 1C. The film thickness of the Cu film 15 formed during 30 seconds (the source gas and the $O_2$ gas were concurrently supplied) in the initial stage of the deposition was about 30 nm. The total thickness of the Cu film formed during the total CVD period of 2 minutes including the period of time where only the source gas was supplied was about 250 nm.

Thereafter, the Cu film formed in this manner was heat-treated under a reduced pressure for 10 minutes using a quartz furnace of hot wall type. The temperature employed in the heat treatment was 450° C., the gas atmospheric employed was $H_2$ and the pressure employed was 0.1 Torr. After the heat treatment, the substrate was cooled in this $H_2$ atmosphere down to room temperature to obtain a sample of this example.

In order to examine the adhesion between the Cu film and TiN layer of this sample having a stack structure consisting of $Cu/TiN/SiO_2/Si$ wafer, a peeling test using a tape (Scotch mending tape, R810, Sumitomo 3M Co.) was conducted. As a result, the peeling of the Cu film was not recognized at all.

On the other hand, the same kind of substrate as employed in the above example was used, and the conventional thermal CVD wherein the concurrent supply of $O_2$ gas during the CVD was omitted was performed using the same apparatus as employed in the above example thereby depositing a Cu film as a comparative example. Then, this Cu film was heat treated in the same $H_2$ atmosphere as employed in the above example, and subsequently subjected to the peeling test under the same conditions as employed in the above example. As a result, the separation of the Cu film in the form of foil from the underlying TiN layer was recognized. Further, another Cu film sample was manufactured by using the conventional CVD method wherein the concurrent supply of $O_2$ gas during the CVD was omitted and the deposited Cu film was not subjected to the heat treatment. When this Cu film sample was subjected to the peeling test under the same conditions as employed in the above example, the separation of the Cu film in the form of foil from the underlying TiN layer was also recognized. Furthermore, when a Cu film sample was prepared in the same manner as in the above example except that the heat treatment under a reduced pressure was omitted, and then subjected to the peeling test under the same conditions as employed in the above example, the separation of the Cu film from the underlying TiN layer was also recognized.

From these experiments, it has been confirmed that by the employment of the Cu film-forming method according to this invention, it is possible to improve the adhesion between a Cu film deposited by means of the thermal CVD and an underlying TiN film.

The impurities in a Cu film formed on an underlying TiN film according to this invention was analyzed using a secondary ion mass spectrometry (SIMS). The elements particularly taken notice of were C, O, F and Si which are constituent components of (hfac)Cu(tmvs) constituting a CVD source gas. The quantification of the impurity concentration in a Cu film deposited by means of the CVD was performed by comparing the detected secondly ion intensity the Cu film with that of a standard sample prepared by ion-implanting a predetermined amount of each of C, O, F and Si into a high purity Cu film (the concentrations of C, O, F and Si are lower than the SIMS detection limit) which was deposited by means of sputtering.

FIG. 2A shows the results of SIMS analysis of impurities in thickness-wise of the Cu film of the sample of this example. As seen from FIG. 2A, the impurity concentration in the Cu film prepared according to this example were $1\times10^{18}$ atoms/cm$^3$ or less (less than the detection limit) as for Si; $2\times10^{17}$ atoms/cm$^3$ as for F; $3\times10^{17}$ atoms/cm$^3$ as for C; and $4\times10^{17}$ atoms/cm$^3$ as for O. When these impurity concentrations are expressed as ratios based on the atomic density of Cu, the ratios are 2 ppm as for F, 4 ppm as for C, and 5 ppm as for O. According to FIG. 2A, the concentrations of C, O and F seem to have been increased in the regions of TiN, SiO$_2$ and Si on the axis of abscissa. However, these changes are caused by the fact that the ion intensity released can be changed depending on the matrix material. Therefore, the concentration value on the axis of ordinate is applicable only to the region of Cu.

Meanwhile, the same substrate and diffusion-preventing layer as those employed in the above example were employed, and a thermal CVD was performed using as a source gas (hfac)Cu(tmvs) for two minutes to deposit a Cu film as a comparative example. The deposition temperature and the partial pressure of the source gas employed in this case were the same as those employed in the above example. In this CVD, the concurrent supply of O$_2$ was not adopted. After the Cu deposition, the Cu film was heat treated in an H$_2$ atmosphere under a reduced pressure as in the case of the above example. The resultant sample according to this comparative example was subjected to the quantitative analysis on the impurities in the Cu film by means of SIMS, the results being shown in FIG. 2B.

As seen from FIG. 2B, the impurity concentration in the Cu film prepared according to this comparative example were $1\times10^{20}$ atoms/cm$^3$ (1,200 ppm) as for F; $7\times10^{20}$ atoms/cm$^3$ (8,300 ppm) as for C; $2\times10^{20}$ atoms/cm$^3$ (2,400 ppm) as for O; and $1\times10^{18}$ atoms/cm$^3$ or less (less than the detection limit) as for Si, thus indicating that several thousand ppm of impurities such as F, C and O were included in the Cu film.

It will be clear from these experiments that the method of forming a Cu thin film according to this invention which comprises the step of concurrently supplying O$_2$ at the initial stage of CVD deposition is very effective in improving the purity of Cu film, so that it is possible according to this invention to reduce the impurity concentration down to $\frac{1}{100}$ or less as compared with that in a Cu film to be obtained using the conventional CVD method.

EXAMPLE 2

FIGS. 3A to 3D are perspective views illustrating the manufacturing steps of a semiconductor device according to a second embodiment of this invention. This example illustrates one example of forming a buried Cu wiring excellent in adhesion on a substrate, wherein a trench is first formed in an insulating layer for forming a buried wiring, and after a TiN barrier layer is formed on the inner wall of the trench, the Cu thin film is deposited thereon.

Figure 3A:
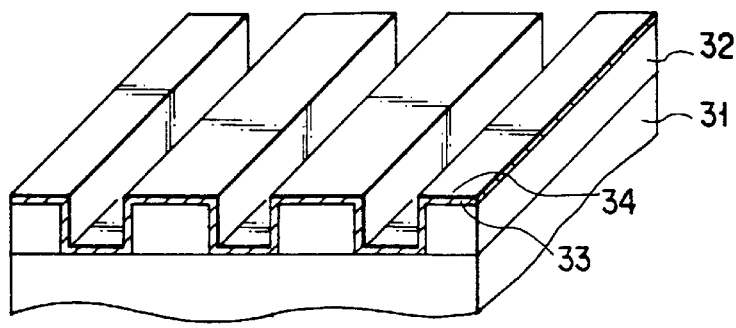
FIGS. 3A to 3D are perspective views illustrating the manufacturing steps of a semiconductor device according to a second embodiment of this invention.

As shown in FIG. 3A, a substrate comprising a silicon wafer 31 on which a silicon oxide film 32 having a thickness of 400 nm was formed was employed for depositing Cu. Then, a resist pattern for forming a wiring pattern was formed on the silicon oxide film 32 by means of lithography. Then, a reactive ion etching was performed using the resist as a mask to form a trench 400 nm in depth and 0.35 m in width on the silicon oxide film 32 for forming a buried wiring.

Then, a TiN thin film 33 was formed by way of sputtering on this substrate to a thickness of 30 nm. This substrate provided with the TiN film was once exposed to air atmosphere in order to transfer the substrate to another film-forming apparatus for depositing Cu. As a result of this exposure, a natural oxide film 34 consisting of a Ti oxide was formed on the surface of the TiN thin film 33 constituting the uppermost surface of the substrate.

Figure 3B:
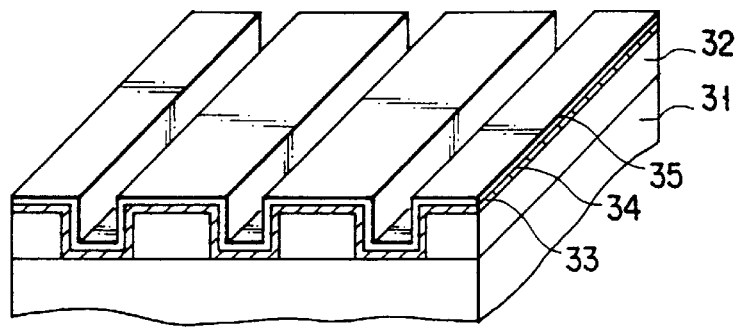
Figure 3C:
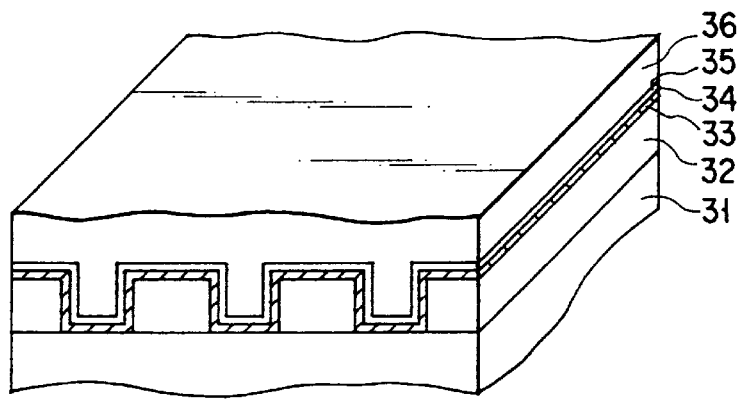

Then, this substrate was mounted in a reaction chamber of a thermal CVD apparatus, and a Cu thin film was deposited all over the surface of the substrate by way of a thermal CVD method under the same conditions as those employed in the aforementioned first example. Specifically, the source gas and O$_2$ gas were concurrently supplied for 30 seconds to form a Cu film 35 as shown in FIG. 3B. Then, the supply of the O$_2$ gas was suspended and the thermal CVD was continued further for 90 seconds by supplying only the source gas to form a Cu film 36 as shown in FIG. 3C.

The film thickness of the Cu film 35 formed during 30 seconds (the source gas and the O$_2$ gas were concurrently supplied) in the initial stage of the deposition was about 30 nm. The total thickness of the Cu film formed during the total CVD period of 2 minutes including the period of time where only the source gas was supplied was about 250 nm.

Thereafter, the substrate having a multilayer structure as mentioned above was heat-treated in a hydrogen gas atmosphere under a reduced pressure for 10 minutes. The temperature employed in the heat treatment was 450° C., the gas atmospheric employed was H$_2$ and the pressure employed was 0.1 Torr.

Figure 3D:
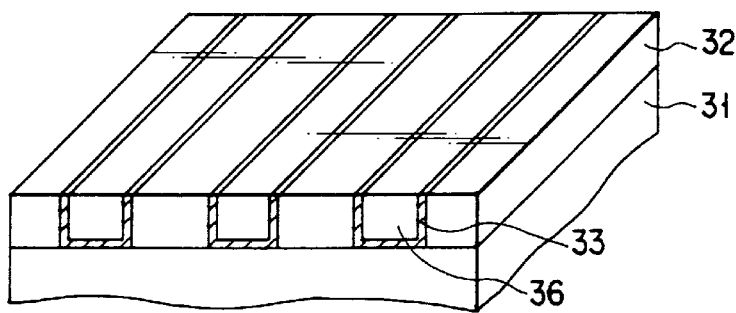

The sample of this invention which was obtained in this manner was worked to form a buried wiring by means of a chemical-mechanical polishing method (CMP). FIG. 3D shows a schematical view of the substrate after the formation of the wiring. In the process of CMP, a slurry comprising glycine, an aqueous solution of hydrogen peroxide, fine silica particles and pure water was employed. During this CMP processing, the peeling of the Cu film was not recognized, indicating an excellent adhesion between the Cu layer and the underlying TiN layer. On the other hand, in the case of the comparative example, the Cu film was stripped away during the CMP processing, failing to form a buried Cu wiring.

When the electric resistance of the buried Cu wiring according to this example was evaluated by way of four probe method of the resistivity measurement, a resistivity of the Cu wiring was found to be 1.7±0.1 $\mu\Omega$·cm at room temperature. Any error in this resistivity would be a measurement error which was generated as the sectional area of the Cu wiring was obtained from the image of scanning electron microscope. The electric resistivity of bulk Cu is 1.7 $\mu$cm at a temperature of 20° C., thus indicating that the electric resistivity of the buried Cu wiring according to this example was substantially the same as that of the bulk Cu owing to the very low concentration of impurity in the Cu film.

EXAMPLE 3

This example illustrates one example demonstrating the improvement of adhesion between a Cu film and a diffusion-preventing layer when the Cu film is formed by means of a thermal CVD method of this invention on the various kinds of diffusion-preventing layers containing a refractory metal.

A substrate comprising a silicon wafer on which a silicon oxide film having a thickness of 100 nm was formed as an insulating film was employed for depositing Cu. Then, various kinds of underlying films shown in Table 1 below were formed to a thickness of 90 nm as a Cu diffusion-preventing layer on the substrate by way of sputtering. Namely, as a material for the diffusion-preventing layer, a thin film of Nb, Ta, W, Mo, TaN, WN, TaSi$_2$ or Ti$_1$Si$_{0.7}$N$_{1.6}$ was employed. This substrate provided with the Cu diffusion-preventing layer was once exposed to air atmosphere in order to transfer the substrate to another film-forming apparatus for depositing Cu. As a result of this exposure, a natural oxide film consisting of an oxide of a refractory metal constituting the diffusion-preventing layer was formed on the surface of the diffusion-preventing layer constituting the uppermost surface of the substrate.

Then, this substrate was mounted in a reaction chamber of a thermal CVD apparatus, and a Cu thin film was deposited on the surface of the substrate by way of a thermal CVD method under the same conditions as those employed in the aforementioned first example. Specifically, the source gas and O$_2$ gas were concurrently supplied for 30 seconds, and then, the supply of the O$_2$ gas was suspended and the thermal CVD was continued further for 90 seconds by supplying only the source gas to form a Cu film.

The film thickness of the Cu film formed during 30 seconds (the source gas and the O$_2$ gas were concurrently supplied) in the initial stage of the deposition was about 30 nm. The total thickness of the Cu film formed during the total CVD period of 2 minutes including the period of time where only the source gas was supplied was about 250 nm.

Thereafter, the Cu film formed in this manner was heat-treated under a reduced pressure for 10 minutes using a quartz furnace of hot wall type. The temperature employed in the heat treatment was 450° C., the gas atmospheric employed was H$_2$ and the pressure employed was 0.1 Torr. After the heat treatment, the substrate was cooled in this H$_2$ atmosphere down to room temperature to obtain a sample of this example.

In order to examine the adhesion between the Cu film and the diffusion-preventing layer of this sample having a laminate structure consisting of Cu/a diffusion-preventing layer/SiO$_2$/Si wafer, a peeling test using a tape (Scotch mending tape, R810, Sumitomo 3M Co.) was conducted. As a result, the peeling of the Cu film was not recognized at all.

On the other hand, the same kind of substrate as employed in the above example was used, and the conventional thermal CVD wherein the concurrent supply of O$_2$ gas during the CVD was omitted was performed using the same apparatus as employed in the above example thereby depositing a Cu film as a comparative example. Then, this Cu film was heat treated in the same H$_2$ atmosphere as employed in the above example, and subsequently subjected to the peeling test under the same conditions as employed in the above example. As a result, the separation of the Cu film in the form of foil from the diffusion-preventing layer was recognized. Further, another Cu film sample was manufactured by using the conventional CVD method wherein the concurrent supply of O$_2$ gas during the CVD was omitted and the deposited Cu film was not subjected to the heat treatment. When this Cu film sample was subjected to the peeling test under the same conditions as employed in the above example, the separation of the Cu film in the form of foil from the diffusion-preventing layer was also recognized. Furthermore, when a Cu film sample was prepared in the same manner as in the above example except that the heat treatment under a reduced pressure was omitted, and then subjected to the peeling test under the same conditions as employed in the above example, the separation of the Cu film from the diffusion-preventing layer was also recognized. the results of these examples and comparative examples are summarized in Table 1.

TABLE 1

| | Adhesivity | | | | | | | |
|---|---|---|---|---|---|---|---|---|
| | Nb | Ta | W | Mo | TaN | WN | TaSi$_2$ | TiSiN |
| Example | ○ | ○ | ○ | ○ | ○ | ○ | ○ | ○ |
| Comparative Example A | x | x | x | x | x | x | x | x |
| Comparative Example B | x | x | x | x | x | x | x | x |
| Comparative Example C | x | x | x | x | x | x | x | x |

In this Table 1, the comparative examples A, B and C are obtained under the conditions as shown below.

Comparative Example A: A Cu-CVD using only a source gas; and a heat treatment in H$_2$ atmosphere.

Comparative Example B: A Cu-CVD using only a source gas; and a heat treatment was not performed.

Comparative Example C: A Cu-CVD using concurrently a source gas and O$_2$ gas; and a heat treatment was not performed.

Marks O and X indicate the following results.

O: The Cu film was not peeled off in the tape peeling test.

X: The Cu film was peeled off in the tape peeling test.

As seen from Table 1, it was confirmed that by the employment of the Cu film-forming method according to this invention, the adhesion between the Cu film deposited via the thermal CVD method and the diffusion-preventing layer comprising a refractory metal can be improved. The diffusion-preventing layers employed in this example are merely some of examples of the underlying layer which can be applicable in this invention. Thus, other kinds of refractory metal, alloys of refractory metal, nitrides of refractory metal, silicides of refractory metal or ternary alloys comprising a refractory metal, Si and N, which are capable of functioning as a diffusion-preventing layer can also be used as an underlying layer in this invention for forming a Cu film having an excellent adhesion.

In the above description, the natural oxide film is formed on the surface of the diffusion-preventing layer. In this invention, however, the diffusion-preventing layer without the natural oxide film may be used. Even if the natural oxide film is not formed on the surface of the diffusion-preventing layer, the surface of the diffusion-preventing layer is readily oxidized by oxygen gas supplied during CVD process, and the same condition as that with the natural oxide film is obtained.

EXAMPLE 4

Figure 4:
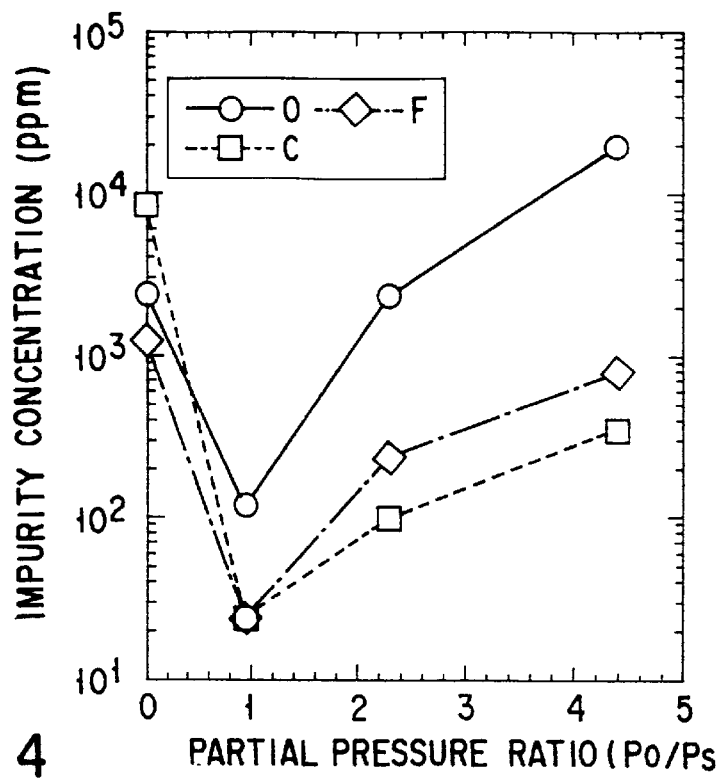
FIG. 4 is a graph showing the impurity concentration in a Cu thin film according to a fourth embodiment of this invention.

FIG. 4 shows a graph illustrating the impurity concentration in a Cu thin film according to a fourth example of this invention. In this example, (Hfac)Cu(tmvs) was employed as a source gas, and a thermal CVD was performed by concurrently supplying the source gas and O$_2$ gas. In this case, the impurity concentration in the Cu film deposited was fluctuated depending on the ratio in partial pressure between the oxygen gas and the source gas. Therefore, an optimum flow supply rate of O$_2$ gas for decreasing the impurity concentration in the Cu film down to 1/100 or less as compared with that to be obtained according to the conventional method is indicated herein.

The Cu film shown in FIG. 4 was prepared as follows. Namely, a silicon wafer was thermally oxidized to form a silicon oxide film having a thickness of 100 nm. Then, a TiN film was deposited on the surface of the wafer as a Cu diffusion-preventing layer by way of sputtering. Then, the Cu thin film about 400 nm in thickness was deposited on the TiN film by means of a thermal CVD method. In this CVD step, (Hfac)Cu(tmvs) was employed as a source gas, and the temperature of the substrate during the deposition of the Cu film was set to 200° C. The $O_2$ gas was introduced into the CVD reaction chamber through a piping which was disposed in separate from the piping for supplying the (Hfac)Cu (tmvs). Further, in order to make clear the effect of reducing the amount of impurities resulting from the concurrent supply of $O_2$ gas, the concurrent supply of $O_2$ gas was continued beginning from the start of the film formation by the CVD until the film formation is completed. The dependency of the effect of reduction in amount of impurities on the partial pressure ratio was measured by changing the partial pressure ratio, i.e. by setting the flow rate of the source gas to a constant value of 13 sccm and changing the flow rate of the $O_2$ gas in the range of 0 to 50 sccm in the preparation of samples.

The axis of abscissa in FIG. 4 represents the partial pressure ratio (Po/Ps) where Ps represents the partial pressure of the source gas and Po represents the partial pressure of the $O_2$ gas, and the axis of ordinate represents the impurity concentration in the Cu film as measured by means of a secondary ion mass spectrometry (SIMS). The elements particularly taken notice of were C, O, F and Si which are constituent components of (hfac)Cu(tmvs) constituting a CVD source gas. However, since the content of Si was smaller than the detection limit (<1 ppm) of SIMS, Si is excluded from FIG. 4. The quantification of the impurity concentration in a Cu film was performed by comparing the detected secondly ion intensity of the Cu film with that of a standard sample prepared by ion-implanting a predetermined amount of each of C, O, F and Si into a high purity Cu film which was deposited by means of sputtering. The left side of the axis of abscissa represents the impurity concentration in the CVD-Cu film which was obtained by the conventional method where the concurrent supply of $O_2$ was not performed.

It will be clear from FIG. 4 that under the condition of Po/Ps ≦2, the concentrations of C and F were decreased by the order of one figure as compared with those in the sample obtained according to the conventional method. Moreover, under the condition of Po/Ps ≦2, the concentration of O was decreased as compared with that in the sample obtained according to the conventional method in spite of the supplying of $O_2$ gas, thus indicating that the concurrent supply of $O_2$ gas is effective in inhibiting the inclusion of impurities resulting from an excessive decomposition of the source gas, if the deposition conditions are suitably selected. In particular, when the Po/Ps ratio was substantially 1, the concentrations of C and F were decreased to about $\frac{1}{100}$ of the conventional CVD-Cu film, thus indicating an excellent effect for improving the purification of Cu film.

In this example, a TiN layer which was once exposed to air atmosphere was employed as a diffusion-preventing layer. However, it is also possible, without diminishing the aforementioned effect of improving the purification of CVD-Cu film according to this invention, to successively deposit Cu directly on a TiN layer without exposing the TiN layer to air atmosphere.

The reason is as follows. In the conventional thermal CVD process, impurities are incorporated into the Cu film whether the natural oxide film is present or not on the surface of the TiN layer. On the other hand, in the CVD process of this invention, since the surface of the TiN layer is readily oxidized by oxygen gas supplied during CVD process, the Cu film of high purity can be obtained in the same manner as the case in which the natural oxide film is formed on the surface of the TiN layer.

EXAMPLE 5

In this example, there is explained the fact that the oxygen-containing Cu film to be obtained by the concurrent supply of the source gas and $O_2$ gas at the initial stage of CVD in the deposition of a Cu film gives an influence to the impurity concentration in a CVD-Cu thin film to be deposited on this oxygen-containing Cu film by the feeding of only the source gas. There are also shown a method of forming the oxygen-containing Cu film as well as the concentration of oxygen in the oxygen-containing Cu film, which are most suited for purifying the CVD-Cu thin film.

Figure 5:
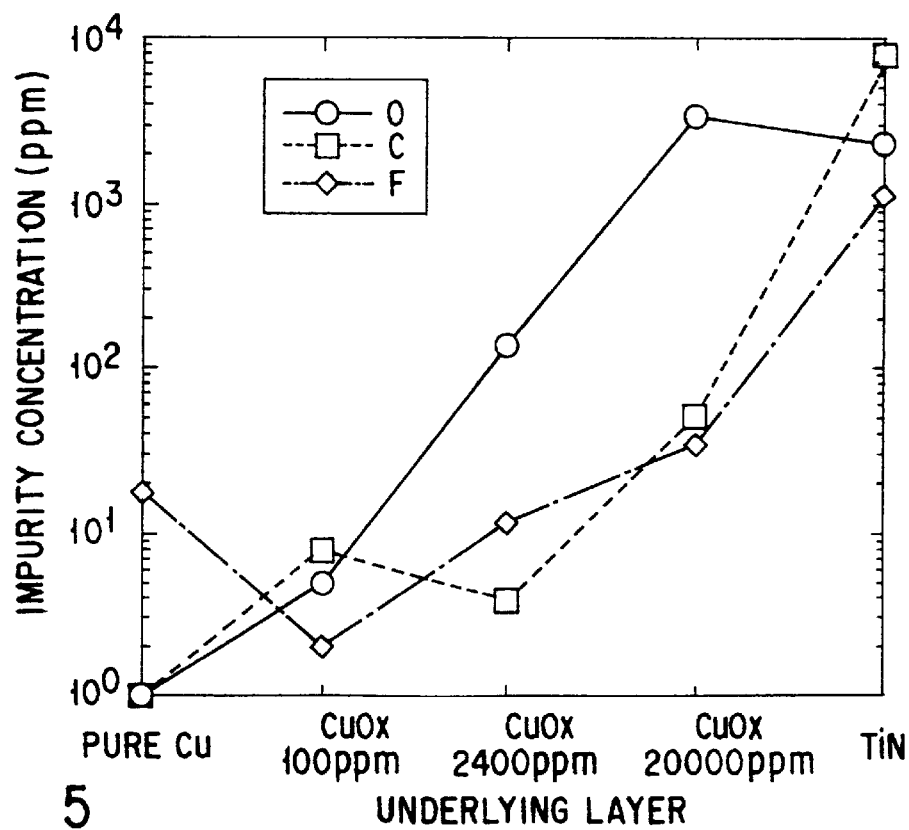
FIG. 5 is a graph illustrating the dependency of the impurity concentration in the Cu layer $f_2$ on the oxygen concentration in the Cu layer $f_1$ wherein the Cu layer $f_2$ is deposited by way of a CVD method using only a source gas on various kinds of the Cu layer $f_1$, each having different oxygen concentration as an example of underlying layer.
Figure 7A:
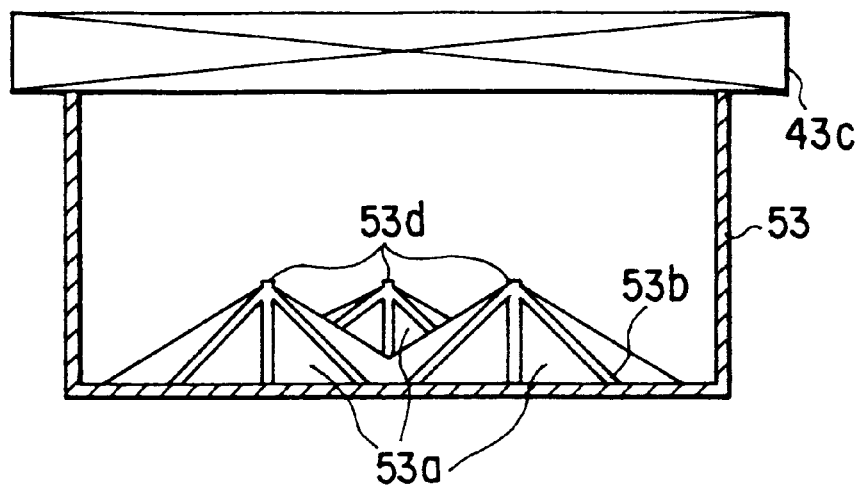
FIGS. 7A and 7B are sectional views schematically showing a modified example of a chemical vapor deposition apparatus of this invention.
Figure 7B:
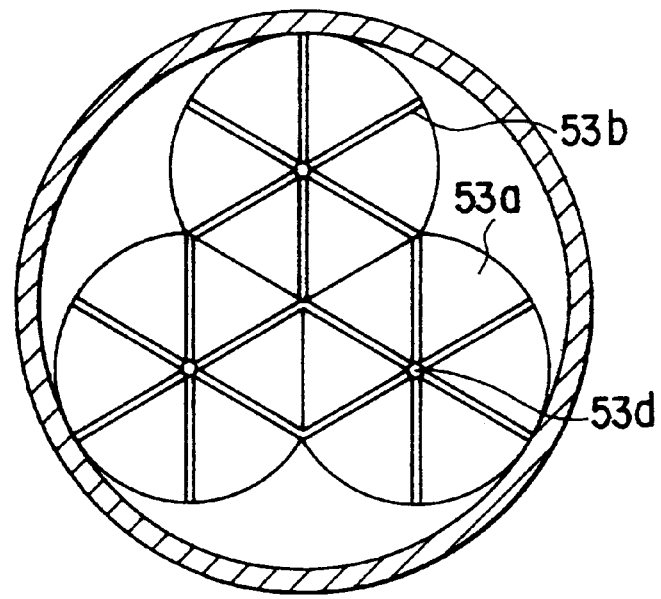

The FIG. 5 shows a graph illustrating the dependency of the impurity concentration in the Cu layer $f_2$ on the oxygen concentration in the Cu layer $f_1$ wherein the Cu layer $f_2$ is deposited by way of a CVD method using only a source gas on various kinds of the Cu layer $f_1$, each having different oxygen concentration as an example of underlying layer. The left side of the axis of abscissa in FIG. 5 represents comparative examples where the Cu layer $f_2$ is deposited on a high purity Cu underlying layer (oxygen concentration <1 ppm) by means of a CVD method using only the source gas, while the right side of the axis of abscissa in FIG. 5 represents conventional examples where the Cu layer $f_2$ is deposited on a TiN underlying layer by means of a CVD method using only the source gas.

Each of the samples of this example shown in FIG. 5 was prepared as follows. Namely, a silicon wafer was thermally oxidized to form a silicon oxide film having a thickness of 100 nm. Then, a TiN film was deposited on the surface of the wafer as a Cu diffusion-preventing layer by way of sputtering. Then, the Cu layer $f_1$ was deposited on the TiN film by means of a thermal CVD method by concurrently supplying both of (Hfac)Cu(tmvs) and $O_2$ gas with the temperature of the substrate being kept 200° C. during the deposition. The oxygen concentration in the oxygen-containing Cu layer was varied by changing the flow rate of the $O_2$ gas. The film thickness of the oxygen-containing Cu layer was set to 100 nm. Thereafter, the Cu layer $f_2$ 300 nm in thickness was deposited on the substrate prepared as described above by means of a CVD method by supplying only the (Hfac)Cu (tmvs) as a source gas with the temperature of the substrate being kept 200° C. during the deposition. The impurity concentrations in the Cu layer $f_1$ and Cu layer $f_2$ were measured by means of SIMS.

As seen from FIG. 5, it will be clearly understood that it is possible through a suitable control of oxygen concentration in the underlying Cu layer $f_1$ to deposit a high purity Cu film by means of a CVD method using only the source gas of (Hfac)Cu(tmvs). In particular, when the oxygen concentration in the underlying Cu layer $f_1$ is about 2,000 ppm or less, the concentrations of C and F in the Cu layer $f_2$ deposited thereon can be controlled to 10 ppm or less, thus decreasing the concentrations of C and F down to about $\frac{1}{100}$ of the conventional CVD-Cu film and indicating an excellent effect of the method of this invention for improving the purification of Cu film.

In the comparative example, a Cu film of high purity formed through sputtering was employed as an underlying layer, and the CVD-Cu layer $f_2$ deposited thereon contained a sufficiently decreased concentration of impurities. However, there is the following problem in the method of using, as an underlying layer, a high purity Cu film formed through sputtering. Namely, in the case of a semiconductor device requiring a Cu wiring, the multilayer wiring structure thereof becomes increasingly dense or fine in wiring and high in aspect ratio, so that it may become more difficult, if a physical deposition method such as sputtering is to be used, to deposit a Cu thin film as an underlying layer while maintaining an excellent step-coverage over a step portion of higher aspect ratio that can be expected in such a multilayer wiring structure.

By contrast, when the method of this invention where an oxygen-containing Cu layer is deposited by means of a CVD method is employed, it is possible to make the most of the excellent step-coverage performance, i.e. one of the characteristics of the CVD method, so that a Cu layer of high purity can be deposited even on a substrate accompanying a step portion of high aspect ratio.

The film thickness of the oxygen-containing Cu layer according to this invention should preferably be as thin as possible due to the following two reasons. A first reason is that it is desirable to minimize the absolute volume of oxygen diffusing from the oxygen-containing Cu layer to the upper Cu layer. A second reason is that the deposition rate of Cu decreases under a CVD condition where the Cu layer containing oxygen without impurities such as F and C is deposited, so that it is desirable to make the thickness of the oxygen-containing Cu layer as thin as possible in view of the productivity.

In the examples 1 to 6, the concurrent supply of $O_2$ gas is restricted to a predetermined period of time starting from the initiation of the deposition of Cu thin film. However, if the deposition rate of Cu film can be disregarded, the supply of $O_2$ gas is not necessarily required to be suspended. It is also possible to employ other kind of oxidizing gas such as ozone gas in place of the oxygen gas.

If there is no natural oxide film formed on a diffusion-preventing film constituting an underlying layer, the problem of adhesion between Cu and the underlying layer would not be raised even if the conventional method is employed. However, as far as the impurities in the Cu film formed according to this invention, the same effect as explained above can be obtained as explained in the first example even if the natural oxide film is not existed on the surface of the underlying layer.

In the above examples, a method of forming a high purity copper thin film excellent in adhesion in relative to the underlying layer has been explained. Now, a chemical vapor deposition apparatus for forming a copper thin film will be explained as follows.

First of all, an apparatus which is capable of stably feeding a large flow rate of gas such as an organometallic complex constituting a source gas for the chemical vapor deposition over the surface of substrate will be explained.

In the deposition of a metallic thin film excellent in surface smoothness, the control of partial pressure of organometallic source is very important. Therefore, the chemical vapor deposition apparatus according to this example is featured in that the supply flow rate of a liquid source to be fed to a vaporizer (or an evaporating chamber) is controlled so as to achieve the control of the partial pressure. Therefore, this vaporizer is provided with a device for immediately evaporating the liquid source without restraining the flow of the source. Namely, this vaporizer is featured to comprise one or a plurality of cone-shaped evaporating surfaces with the supply port for the liquid source material being disposed at the top thereof, the evaporating surfaces being formed with a plurality of grooves running downward from the supply port in order to prevent the retention of the liquid source flow ejected out of the supply port.

With this structure of the vaporizer, it is possible, without causing the retention of the liquid source, to immediately evaporate the liquid source introduced into the vaporizer. The evaporating surface should preferably be formed of an insulating material such as oxides (silicon oxide) or nitrides (silicon nitride). Because if the evaporating surface is formed of a conductive material such as a metal, the source tends to be decomposed due to the catalytic effect of the metallic surface, so that even if the temperature of the source is controlled at a low degree of around the evaporation temperature which is generally low enough to inhibit the decomposition of the source, the decomposition of the source may proceed, thus causing the vaporizer to be filled with the decomposed products of low vapor pressure.

The storage chamber for storing an organic metal is featured in that it is capable of being cooled lower than or equal to room temperature and being kept at a pressurized state as it is filled with an inert gas such as Ar gas. The purpose of cooling the storage chamber is to inhibit the denaturing of the source resulting from the thermal decomposition of an organic metal as explained above in relative to the vaporizer.

One of the features of this apparatus resides in that the storage of a source which can be easily decomposed is conducted in the storage chamber which is cooled all the time, and only a required amount of source for effecting the chemical vapor deposition is supplied to the vaporizer. As a result, the decomposition of raw material during the storage thereof can be inhibited, and the fluctuation of vapor pressure due to the denaturing or degradation of source, or the fluctuation in quality of the resultant Cu film can be prevented. Furthermore, since the interior of the storage chamber can be kept at a pressurized state by the introduction of an inert gas, the liquid surface of the organic metal is kept pressurized so as to make it possible to deliver in a pressurized manner the organic metal to the vaporizer via a supplying system.

The storage chamber is communicated with the vaporizer via a supplying apparatus comprising a fine tube and a piezo-valve. The switching of the piezo-valve is linked to a manometer disposed in the reaction chamber. Namely, the pressure in the reaction chamber during the chemical vapor deposition is detected by the manometer for example Baratron manometer disposed in the reaction chamber, and on the basis of this detected pressure, the piezo-valve is switched so as to control the partial pressure of the source gas to become a prescribed range, thus making constant the pressure in the reaction chamber. When the supply flow rate of the source becomes sufficient enough to allow a metallic thin film to be deposited to a predetermined thickness, the piezo-valve is closed and the chemical vapor deposition is terminated.

For the purpose of supplying the vapor of organometallic complex evaporated in the vaporizer uniformly over the surface of the substrate, a rectifying plate is disposed between the vaporizer and the reaction chamber. The rectifying plate is provided with a large number of gas-ejecting ports facing the substrate, and partitions the reaction chamber from the vaporizer. The rectifying plate has a surface area which is larger than that of the substrate, and the area of the mount region of the gas-ejecting ports formed on the rectifying plate is larger than that of the substrate. With the provision of this rectifying plate, the organometallic complex gas evaporated in the vaporizer can be supplied uniformly over the substrate via the gas-ejecting ports.

It is also possible to interpose a mechanism between the rectifying plate and the vaporizer for closing the vaporizer from the reaction chamber so as to make it possible to initiate or suspend the supply of the source gas to the reaction chamber.

The schematic structure of the above chemical vapor deposition apparatus will be explained below.

FIG. 6 shows a schematic view of the chemical vapor deposition apparatus. Referring to FIG. 6, the reference numeral 41 represents a reaction chamber for forming a film by way of a chemical vapor deposition. The interior of the reaction chamber 41 can be exhausted via a conductance valve 41d by a vacuum pump as indicated by 45c. The reaction chamber 41 is provided therein a susceptor 41c made of quartz glass holding a silicon wafer 41b (a substrate) with the surface thereof being directed downward. The silicon wafer is pressed via the susceptor onto a heater block 41a so as to be heated, thus making it possible to set the surface temperature thereof to a predetermined range. Thus, the organometallic complex constituting a source gas is caused to decompose on this heated surface of the substrate, allowing a predetermined metallic film to be deposited thereon.

The reference numeral 43 indicates an vaporizer for evaporating the organometallic complex fed in a liquid state. The vaporizer can be heated as a whole by means of a heater. The cross-section of the vaporizer 43 is circular in shape, and the supply port 43d for the liquid source is disposed at the center of the circular shape. In this vaporizer 43, a cone-shaped evaporating surface as indicated by 43a is provided with the supply port for the liquid source being disposed at the top thereof. This evaporating surface 43a is formed of quartz glass and provided with a plurality of trenches 43b. The organic complex is evaporated as it runs downward along the heated evaporating surface 43a and introduced into the reaction chamber 41 as indicated by 45b.

The vaporizer 43 can be exhausted via a valve 43e in separate from the reaction chamber 41, thus discharging any residual gas such as water vapor from the vaporizer 43. On the upper portion of the vaporizer 43 is mounted a valve 43c partitioning the reaction chamber 41 from the vaporizer 43.

The reference numeral 42 indicates a rectifying plate which is disposed for supplying the vapor of organometallic complex evaporated in the vaporizer uniformly over the surface of the substrate, and provided with a plurality of small holes. The rectifying plate 42 may be disposed at several places along the source gas flow beginning from the upstream down to the downstream thereof. In this case, at least one of the rectifying plates 42 which is disposed nearest to the reaction chamber 41 should be of the size which is larger than the diameter of the wafer constituting the substrate. Gas 42b such as an inert gas can be also introduced via a valve 42a over the rectifying plate 42 whereby making it possible to control the supply of the gas.

The liquid organometallic complex 45a as a source can be stored in a storage chamber 44. This storage chamber 44 is kept at a low temperature (10° C.) all the time by way of a cooling tank 44e. The interior of the storage chamber 44 is filled with an inert gas (Ar gas) as indicated by 44d, thus being kept at a pressurized state (980 Torr). Namely, the liquid surface of the organometallic complex 45a filled in the storage chamber 44 is kept pressurized with the inert gas 44d introduced through the valve 44c so that it possible to deliver the organometallic complex in a pressurized manner to the vaporizer 43 by opening a valve 44a.

The storage chamber 44 is communicated with the vaporizer 43 via a fine tube 44b and a piezo-valve 44a is disposed on a portion of the fine tube 44b which is located just before the vaporizer 43. The switching of the piezo-valve 44a is actuated by the output from the Baratron manometer 41e disposed in the reaction chamber 41. Namely, on and off of the piezo-valve 44a is effected so as to control the partial pressure within the reaction chamber 4 is kept at a predetermined pressure. The diameter of the fine tube 44b should desirably be as small as possible so as to allow a small amount of the liquid source to be supplied in an excellently controlled manner. In this example, the a glass tube having an inner diameter of 0.5 mm is employed as the fine tube 44b.

FIGS. 9A and 9B illustrate another example of vaporizer. The reference numeral 53d is a supply port for a liquid source; 53a, an evaporating surface; and 53b, a trench. As shown in these FIGS., a plurality of supplying mechanisms may be mounted thereon. With this construction, it is possible to instantly evaporate a large amount of an organometallic complex, and to extensively generate the origin of evaporation. Therefore, it is possible to supply a large amount of source gas uniformly over the surface of a wafer of large diameter.

As for the organic copper complex, β-diketonate copper compound which is liquid at room temperature can be employed. In particular, an organic copper complex which has a high vapor pressure and can be decomposed on the surface of substrate at a relatively low temperature is preferable. Specific examples of such a compound are hexafluoroacetylacetonate trimethylvinylsilane copper $\{[(CF_3CO)_2CH]Cu(C_5H_{12}Si)\}$, hexafluoroacetylacetonate trimethylsilylacetylene copper $\{[(CF_3CO)_2CH]CU(C_5H_{10}Si)\}$, hexafluoroacetylacetonate bistrimethylsilylacetylene copper $\{[(CF_3CO)_2CH]Cu(C_4H_9Si)\}$, or a mixture of any of these organic copper complexes.

The vapor pressure of these organic copper complexes is relatively high. However, as the diameter of a silicon wafer constituting a substrate becomes larger, the volume of reaction chamber is required to be extremely larger, so that it is very difficult, according to the conventional method, to assure a sufficient degree of supply flow rate of the organic copper complex.

By contrast, the above problem is solved according to the method of this invention, wherein the organic copper complex supplied in a state of liquid is immediately evaporated without being kept retained by using a vaporizer having characteristics as explained above, thus making it possible to supply a large flow rate of the organic copper complex to the reaction chamber.

Moreover, since the organic copper complex is not kept retained in the vaporizer, the supply flow rate of the organic copper complex to the reaction chamber is identical with the supply flow rate of the liquid source. Accordingly, if the amount of source to be employed in one film-forming process is determined in advance, the operation of forming a film can be suspended when this amount of source has been consumed, thus making it possible to stably obtain a film of prescribed thickness in good reproducibility.

Moreover, since the employment of any carrier gas is not required in principle according to the method of forming a thin film using this apparatus, there is no possibility of lowering the concentration of source gas by the addition of a carrier gas, thus improving the utilization of the source gas and making this method advantageous in view of production cost.

A conductance valve may be interposed between the reaction chamber and a vacuum pump for exhausting the reaction chamber, and the opening ratio of the conductance valve may be automatically controlled by the pressure inside the reaction chamber, thus keeping the pressure inside the reaction chamber constant. In this case also, the method of utilizing a large flow rate in supply of source gas according to this invention is also useful in obtaining a copper thin film excellent in surface smoothness.

In the followings, a method of forming a metallic thin film using aforementioned chemical vapor deposition apparatus will be explained.

EXAMPLE 6

This example illustrates one example of forming a copper thin film on a wafer (TiN:60 nm/SiO$_2$:100 nm/Si wafer) having a TiN layer as an underlying layer for deposition by using the chemical vapor deposition apparatus shown in FIG. 6.

The TiN is a barrier metal for preventing Cu atoms from diffusing into the SiO$_2$ layer or Si layer. The deposition temperature or the surface temperature of the substrate was set to 160° C. The reaction chamber and the vaporizer were exhausted to 5×10$^{-2}$ Torr. Then, the valve 42a shown in FIG. 6 was opened to allow Ar to flow at a flow rate of 100 sccm. At this moment, the opening ratio of the conductance valve 41d was adjusted so as to set the pressure inside the reaction chamber to 2.5×10$^{-1}$ Torr. Subsequently, the valve 42a was closed to stop the supply of the Ar gas, and the reaction chamber 41 was again exhausted. The vaporizer was heated to 60° C. As a source for chemical vapor deposition, hexafluoroacetylacetonate trimethylvinylsilane copper {[(CF$_3$CO)$_2$CH]Cu(C$_5$H$_{12}$Si)} was employed.

Then, the automatic control mechanism for controlling the pressure inside the reaction chamber which can be effected by the piezo-valve 44a was kept in the state of stand-by, and the setting value of pressure retention was set to 2.5×10$^{-1}$ Torr. Then, the automatic control mechanism was turned into an operation state, and the piezo-valve 44a was opened thus supplying the source to the vaporizer 43 so as to maintain the pressure inside the reaction chamber 41 at 2.5×10$^{-1}$ Torr, thus allowing the chemical vapor deposition of copper thin film to proceed. The gate valve 43c disposed between the reaction chamber 41 and the vaporizer 43 may be opened in concurrent with the supply of the organic copper complex or before the supply of the organic copper complex. When the amount of the liquid source passed through the piezo-valve 44a became 0.8 g, the piezo-valve 44a was closed, thus suspending both of the supply of the source gas and the deposition of the copper film. The total time consumed up to this moment was about 5 minutes.

The copper film thus obtained had a mirror-like surface, and the reflectance of the film which is an indications of the surface smoothness was found to be 95% (the reflectance of the copper film having a thickness of 400 nm, deposited at room temperature by means of sputtering was assumed as being 100%) as measured using a light of 780 nm in wavelength. This demonstrates that the surface smoothness of the copper thin film to be obtained by the aforementioned chemical vapor deposition method is comparative to that to be obtained by the sputtering method.

When the electric resistance of the copper thin film according to this example was evaluated by way of four probe method of the resistivity measurement, a resistivity of the copper thin film was found to be 2.0 μΩ·cm, which was lower than that (2.8 μΩ·cm) of the conventional aluminum thin film, thus indicating an excellency for use as a low resistance fine interconnecting wiring. Further, when the impurity elements in a Cu thin film was analyzed by way of Auger electron spectroscopy, any of elements such as C, O, F and Si included in the organometallic complex were less than the detection limit (about 2%), indicating a high purity of the copper thin film obtained in this example.

EXAMPLE 7

This example illustrates one example of forming a copper thin film which is excellent in the step-coverage and surface smoothness by using the chemical vapor deposition apparatus shown in FIG. 6. As a substrate, a silicon wafer provided on its surface with a silicon oxide film was employed and a pattern of trench was formed on the silicon oxide film by making use of a lithography technique. Subsequently, TiN as a barrier metal was deposited all over the surface of the trench, thus preparing a substrate for deposition. Namely, the stack structure of this substrate was TiN:30 nm/SiO$_2$:400 nm/Si wafer. The trench pattern formed on the SiO$_2$ was 400 nm in depth and 330 nm in width.

The deposition temperature or the surface temperature of the substrate was set to 160° C. The reaction chamber and the vaporizer were exhausted to 5×10$^{-2}$ Torr. Then, the valve 42a shown in FIG. 6 was opened to allow Ar to flow at a flow rate of 100 sccm. At this moment, the opening ratio of the conductance valve 41d was adjusted so as to set the pressure inside the reaction chamber to 2.5×10$^{-1}$ Torr. Subsequently, the valve 42a was closed to stop the supply of the Ar gas, and the reaction chamber 41 was again exhausted. The vaporizer was heated to 60° C. As a source for chemical vapor deposition, hexafluoroacetylacetonate trimethylvinylsilane copper {[(CF$_3$CO)$_2$CH]Cu($_c$5H$_{12}$Si)} was employed.

Then, the automatic control mechanism for controlling the pressure inside the reaction chamber which can be effected by the piezo-valve 44a was kept in the state of stand-by, and the setting value of pressure retention was set to 2.5×10$^{-1}$ Torr. Then, the automatic control mechanism was turned into an operation state, and the piezo-valve 44a was opened thus supplying the source to the vaporizer 43 so as to maintain the pressure inside the reaction chamber 41 at 2.5×10$^{-1}$ Torr, thus allowing the chemical vapor deposition of copper thin film to proceed. The gate valve 43c disposed between the reaction chamber 41 and the vaporizer 43 may be opened in concurrent with the supply of the organic copper complex or before the supply of the organic copper complex.

First of all, in order to confirm the excellency in step-coverage of the deposited film, the supply of the organic copper complex was suspended as to terminate the deposition of Cu before the trench is completely buried with Cu. Namely, when the amount of the liquid source passed through the piezo-valve 44a became 0.16 g, the piezo-valve 44a was closed, thus suspending both of the supply of the source gas and the deposition of the copper film. The total time consumed up to this moment was about 1 minutes.

The copper film thus obtained was of continuous film and excellent in surface smoothness in spite of the fact that the film thickness of the copper film thus obtained was as very thin as 80 nm. Further, the film thickness within the trench was almost identical with that outside the trench (a terrace portion), and the edge portion of the trench was also uniformly covered with the deposition of Cu, thus indicating an excellent step-coverage of the Cu deposition.

In another example, the trench pattern was completely filled with Cu. Then, the same procedures as explained above were repeated except that the liquid raw material was supplied in the amount of 0.8 g. The total time consumed in this case was about 5 minutes. As a result, it was possible to achieve the trench could be flatly buried with Cu without causing the generation of void even if any heat treatment after the deposition of Cu.

EXAMPLE 8

In this example, the influence of the source gas pressure on the shape of the deposited copper thin film was experimentally examined by using the chemical vapor deposition apparatus shown in FIG. 6. The surface temperature of the substrate was set to 160° C. The chemical vapor deposition of the copper thin film was performed with the partial pressure of the organic copper complex in the reaction chamber 41 being controlled to range from $5 \times 10^{-2}$ Torr to $5 \times 10^{-1}$ Torr. The adjustment of the partial pressure was performed in such a manner that Ar gas was allowed to flow at a flow rate of 100 sccm from the valve 43e to the reaction chamber, at the same time the opening ratio of the conductance valve 41d was adjusted setting the pressure inside the reaction chamber 41 to $5 \times 10^{-1}$ Torr, and the supply flow rate of the liquid source to the vaporizer 43 was automatically controlled so as to set the source pressure inside the reaction chamber 41 to a prescribed value. The total volume of the organic complex to be used one operation of forming the Cu film was made constant regardless of the pressure condition of the source gas.

Namely, the total volume of the source gas was made constant and the supply flow rate of the source gas was changed, thus changing the pressure inside the reaction chamber. As a deposition substrate, a wafer having a TiN surface layer (TiN:30 nm/$SiO_2$:400 nm/Si) was employed. As an organic copper complex constituting a source for chemical vapor deposition, hexafluoroacetylacetonate trimethylvinylsilane copper $\{[(CF_3CO)_2CH]Cu(C_5H_{12}Si)\}$ was employed.

The copper film thus obtained under the aforementioned conditions was measured regarding to the flatness of the film, the resultant being expressed by the reflectance (%). In this measurement, the film thickness of the samples was set to 400 nm, and a light 780 nm in wavelength was employed. A copper thin film showing a reflectance was 90% or more was 50 nm or less in surface roughness thereof, thus being considered as excellent in smoothness.

The results measured on the reflectance were as follows. The reflectance was 74.1% when the partial pressure of the source gas was $5 \times 10^{-2}$ Torr; the reflectance was 91.8% when the partial pressure of the source gas was $1 \times 10^{-1}$ Torr; and the reflectance was 94.7% when the partial pressure of the source gas was $5 \times 10^{-1}$ Torr.

As seen from these results, it is desirable, for forming a copper thin film having an excellent surface smoothness, to keep the partial pressure of the source inside the reaction chamber to $1 \times 10^{-1}$ Torr or more.

Almost the same results were obtained even when another organic copper complex which is liquid at room temperature such as hexafluoroacetylacetonate trimethylsilylacetylene copper $\{[(CF_3CO)_2CH]Cu(C_5H_{10}Si)\}$ or hexafluoroacetylacetonate bistrimethylsilylacetylene copper $\{[(CF_3CO)_2CH]Cu(C_4H_9Si)\}$ was employed in place of the organic copper complex employed in the above experiments.

Another example of a chemical vapor deposition apparatus which is capable of stably supplying, while keeping a good controllability, a large amount of source gas to a CVD reaction chamber will be explained in the followings.

FIGS. 8A to 8C illustrate a CVD source supplying apparatus to be used in a chemical vapor deposition apparatus of this invention. Referring to FIGS. 8A to 8C, a cylinder 61 is disposed in a cylindrical 62 in such a manner that the cylinder 61 does not coincide with the central axis of the revolver 62. The number of the cylinder 61 may be single or plural. Each cylinder 61 is assembled in such a manner that when the revolver 62 is rotated to a prescribed rotation angle, one end of the cylinder 61 is communicated with a supply port 64 of a liquid source as shown in FIG. 8A.

Since a pressurized liquid CVD source is always supplied via a piping to the supply port 64 of a liquid source, when the cylinder 61 is connected with a supply port 64 as shown in FIG. 8A, a prescribed amount of liquid source is charged via the one end portion 65 of the cylinder 61 into the cylinder 61. During this charging of the liquid source, the other end portion 66 (opposite to that facing the supply port) is kept closed with a partition wall 71 covering the revolver 62 so as to prevent the source from leaking out of the cylinder 61.

Then, when the revolver is further rotated to a prescribed angle passing over the state shown in FIG. 8B so as to take a position as shown in FIG. 8C, the end portion 65 of the cylinder 61 filled with the liquid source is caused to superimpose with a high-pressure gas supply port 67. In this occasion, the other end 66 of the cylinder 61 is caused to superimpose with a source-ejecting port 68. Since the high-pressure gas supply port 67 is always supplied with a pressurized inert gas via a piping, the liquid source filled fully in the cylinder 61 is pushed toward the source-ejecting port 68 by the inert gas as soon as the cylinder 61 is superimposed with the high-pressure gas supply port 67. In this manner, a prescribed volume of the CVD source is supplied or ejected to the CVD reaction chamber.

Through the alternate repetition of the source-charging step to the cylinder 61 and the source-ejecting step from the cylinder 61, it is possible to supply a predetermined volume of the CVD source to the CVD reaction chamber.

Figure 9:
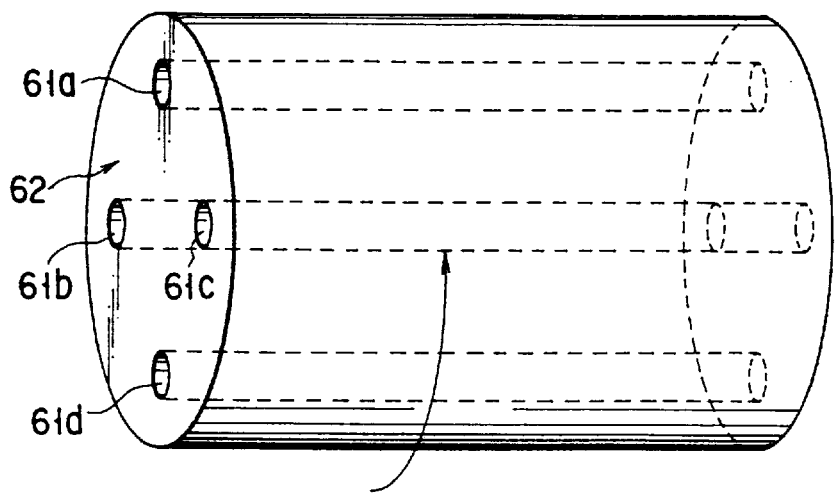
FIG. 9 is a perspective view illustrating a revolver provided with a plurality of cylinders.

In the CVD source-supplying apparatus shown in FIGS. 8A to 8C, only one cylinder 61 is disposed in the revolver 62. However, it is possible to dispose a plurality of cylinders (61a to 61d) in the revolver 62 as shown in FIG. 9. In this case, if these cylinders 61a to 61d should preferably be distributed around the central axis of the revolver 62, each kept apart equidistantly from each other, thus making it possible to successively perform the charging and ejection of the source.

The volume of the cylinder 61 should preferably be not more than the volume of the liquid source which is required for performing one operation of the CVD film-forming though it may depend on the purpose of use. For example, in the case of a CVD apparatus to be used only for depositing a thin film of predetermined thickness, the volume of the cylinder 61 may be almost equal to the volume of the liquid source which is sufficient for depositing the thin film of such a predetermined thickness. On the other hand, if thin films differing in thickness are to be deposited using the same apparatus, the volume of the cylinder may be minimized and the ejection for supplying a source may be repeated several times until a film of desired thickness can be obtained.

Figure 10:
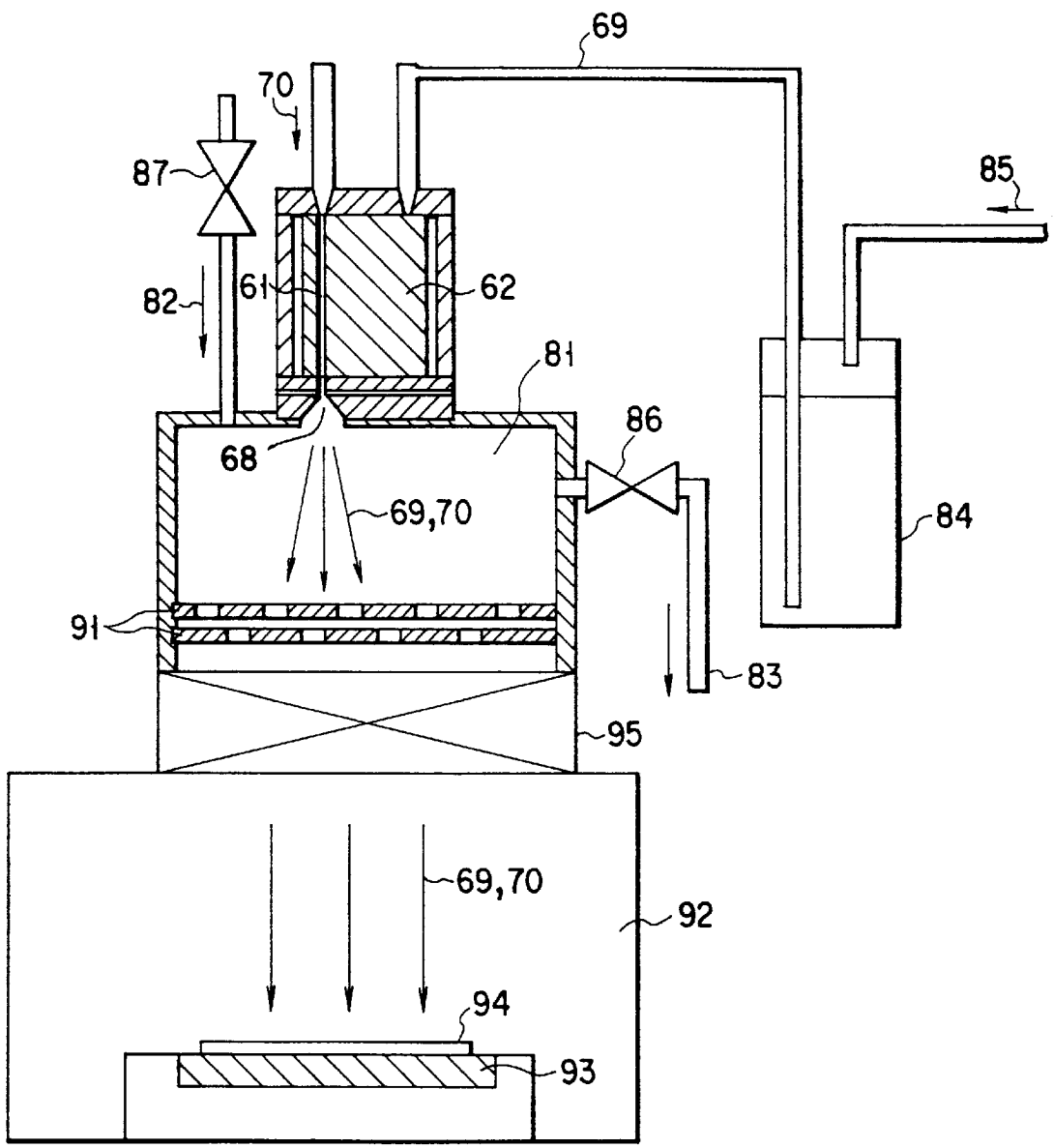
FIG. 10 schematically illustrates a CVD apparatus provided with the CVD source-supplying apparatus shown in FIGS. 8A to 8C.

FIG. 10 illustrates a CVD apparatus provided with such a feeder for CVD source as mentioned above. Referring to FIG. 10, a source-ejecting port 68 is communicated with an vaporizer 81 having a sufficient volume as compared with that of the cylinder 61. The vaporizer 81 is adapted to be heated thereby to heat a CVD source supplied in the form of liquid or mist so as to immediately evaporate the CVD source. A portion of the source-ejecting port 68 which is contacted with the revolver 62 should preferably be kept at room temperature. The reason for this is that if the temperature of this portion is relatively high, the undesirable decomposition may occur at the source-ejecting port 68 having a low conductance, thus causing the clogging of the source-ejecting port 68. Therefore, the cylinder side portion of the source-ejecting port 68 should be thermally insulated from the vaporizer. It is also advisable to positively cool the revolver.

The source gas evaporated at the vaporizer 81 passes through a gas-rectifying plate 91 and then introduced over the heated surface of a substrate 94 disposed in a CVD reaction chamber 92. In this case, a carrier gas 83 such as an inert gas may be introduced into the vaporizer 81 in separate from the source material gas-supply system.

Then, a method of depositing a thin film by making use of this chemical vapor deposition apparatus of this invention will be explained referring to an example of depositing Cu film by means of CVD. As for the CVD source, an organic copper compound which is liquid at room temperature such as hexafluoroacetylacetonate copper olefin or hexafluoroacetylacetonate copper alkyne may be employed.

The organic copper compound is transferred from the storage tank to the source-supplying port by the pressure of an inert gas. Since this liquid source (organic copper compound) is always pressurized by the inert gas, the liquid organic copper compound transferred up to the source-supplying port is always kept pressurized. Therefore, when the revolver of the source-supplying apparatus is rotated to a prescribed angle, the liquid organic copper compound thus pressurized can be ejected into the cylinder from the supplying port.

Then, the revolver is further rotated to connect the cylinder filled with the organic copper compound to the ejection port as well as to the high pressure gas-supplying port. Under this condition, the organic copper compound is transferred while being pushed by the high pressure gas to the vaporizer from the ejection port. Since the vaporizer is heated up to a temperature which is not more than the thermal decomposition initiation temperature of the organic copper compound, the organic copper compound thus ejected can be immediately evaporated. For example, when (Hfac)Cu(tmvs) is employed as the organic copper compound, the temperature of the vaporizer is desirably heated to not higher than 90° C.

The source gas evaporated in the vaporizer is transferred via a gas-diffusion plate to the surface of the substrate disposed in the CVD reaction chamber. In this occasion, the rout of source gas beginning from rectifying the vaporizer down to the CVD reaction chamber via the gas-rectifying plate is desirably heated in advance to a temperature equal to or slightly higher than the temperature of the vaporizer in view of preventing the re-condensation of the source gas. An inert carrier gas may be introduced into the vaporizer in view of inhibiting the retention of the source gas in the way of the rout beginning from the vaporizer down to the CVD reaction chamber. The substrate should be heated to a suitable temperature for allowing the deposition of Cu. For example, when the aforementioned (Hfac)Cu(tmvs) is employed as the source gas in the thermal CVD, the temperature of the substrate is desirably heated to 200° C. or lower.

The process of forming a Cu film to a desirable thickness by making use of the CVD apparatus according to this invention can be performed as follows. Namely, after the vaporizer is sufficiently exhausted through a bypass line 83, the gate valve 95 interposed between the vaporizer and the CVD reaction chamber is opened. Subsequently or almost instantaneously, the source gas is ejected from the cylinder by making use of the aforementioned method of ejecting the source gas. By rotating the cylinder, the ejection of the source gas can be successively performed several times until a desired film thickness can be attained.

Upon finishing the predetermined times of source gas ejection, the pressure inside the CVD reaction chamber is allowed to decrease until it becomes sufficiently lower than the pressure during the source gas ejection, and then the gate valve 95 is closed. Thereafter, the vaporizer is evacuated via the bypass line 83. This evacuation can be performed while passing an inert gas into the vaporizer. With these procedures, one film-forming operation is finished.

Although the above explanation of the CVD apparatus according to this invention is centered on the examples where the formation of a Cu film was performed by way of CVD, it is also possible to employ this CVD apparatus in the method of using other kinds of CVD method using a liquid CVD source. For example, the CVD apparatus and CVD method of this invention are applicable to a CVD method for forming various kinds of insulating film such as; a CVD method for forming an Al thin film using a liquid organic aluminum compound such as triisobutyl aluminum; a CVD method for forming a Ti thin film or TiN thin film using an organic titanium compound such as tetradimethylamide titanium; a CVD method for forming a $Ta_2O_5$ thin film using an organic tantalum compound such as pentaethoxy tantalum; or a CVD method for forming a $SiO_2$ thin film using an organic silicon compound such as tetraethoxy silane.

The CVD apparatus of this invention is applicable not only to organometallic compounds as a CVD source, but also to inorganic metals which are liquid at or near the normal temperature. For example, metal halides such as $TiCl_4$ which is liquid at room temperature may be employed as a source.

Although thermal CVD methods have been explained in relative to the CVD apparatus of this invention, the CVD source-supplying apparatus and the CVD source-supplying method according to this invention can be also applicable to other kinds of CVD methods such as a plasma CVD method or an optical CVD method.

It is possible according to the chemical vapor deposition apparatus of this invention to instantaneously supply a large volume and a constant volume of CVD source gas to a CVD reaction chamber by performing the rotation of a revolver provided therein with a cylinder of predetermined capacity, thus ejecting a predetermined amount of the liquid CVD source filled in the cylinder. Moreover, since the chemical vapor deposition apparatus of this invention is provided with a revolver mechanism which is capable of functioning as a meter for CVD source and also as a transporting means, it is no more required to provide a heated on-off mechanism (valve) of low conductance which may set forth a problem in a continuous source-supplying method as in the case of the conventional liquid-transporting method. Therefore, it is possible according to this invention to stably supply a source without causing a problem such as clogging of valve due to the decomposition or denaturing of the CVD source.

A specific example of the aforementioned chemical vapor deposition apparatus will be explained as follows.

EXAMPLE 9

Figure 11:
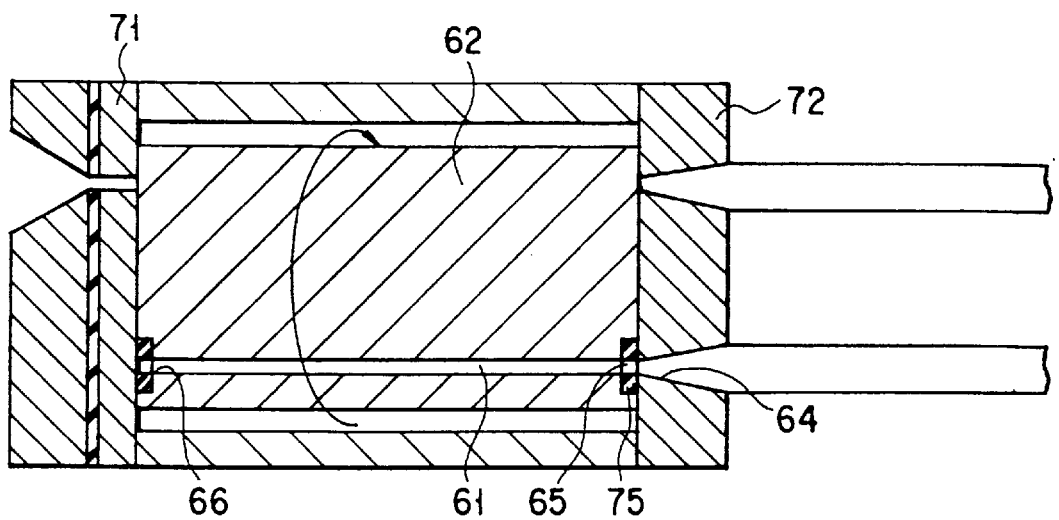
FIG. 11 is a sectional view illustrating another example of CVD source-supplying apparatus to be used in a chemical vapor deposition apparatus of this invention.

This example explains one example where the CVD apparatus according to this invention is applied to the formation of a Cu thin film. FIG. 11 shows schematic views of cylinder and revolver in the source-supplying apparatus used in a chemical vapor deposition apparatus of this invention. The cylinder 61 is formed by making a columnar hole 4 mm in inner diameter and 10 mm in depth (the volume of the cylinder: 0.13 cc) in the revolver. The central axis of the cylinder 61 is set apart from the central axis 63 of the revolver 62. The revolver 62 columnar in shape is provided with a mechanism for allowing the revolver 62 to rotate about its central axis 63 by means of a step motor having a sufficient torque. The cylinder 61 is housed in a container comprising partition 71 and 72 and being capable of hermetically closed as shown in FIG. 11. The partition 71 and 72 are provided with a liquid source-supplying port 64, a pressure gas-supplying port 67 and a source-ejecting port 68, each located to coincide with the open ends 65 and 66 of the cylinder 61 as the revolver 62 is rotated as shown in FIG. 11. The source material-supplying port 64 and the pressure gas-supplying port 67 are symmetrically disposed in relative to the central axis 63 of the revolver 62. On the other hand, the pressure gas-supplying port 67 and the source-ejecting port 68 are disposed to face to each other with the revolver 62 being disposed therebetween.

The inner diameters of all of the liquid source-supplying port 64, the pressure gas-supplying port 67 and the source-ejecting port 68 are made equal to the inner diameter of the cylinder 61, i.e. 4 mm. A Teflon ring 75 is mounted on the end portions of the cylinder 61 so as to prevent the liquid CVD source from being leaked out of the cylinder 61 during the rotation of the revolver 62. The partition 71 disposed on the source ejection port side is of 3-ply structure comprising a quartz plate interposed in the middle for improving the thermal insulation property thereof. Furthermore, the source-ejecting port 68 is tapered expanding outward so as to make it more difficult for the ejected source to deposit thereon.

Now, this raw material-supplying apparatus was set to communicate with the CVD reaction chamber 92 as schematically illustrated in FIG. 10. A liquid Cu-CVD source, (Hfac)Cu(tmvs) was transferred under pressure from the storage tank 84 kept at room temperature to the liquid source-supplying port 64 by making use of Ar gas pressurized to 1 kgG/cm$^2$. On the other hand, Ar gas pressurized to 2 kgG/cm$^2$ was supplied via a mass flow controller (not shown) to the pressure gas-supplying port 67. The inner surface of the vaporizer was coated with a Teflon layer, thus making the inner surface inactive to the decomposition of the CVD source.

A gas rectifying plate 91 made of quartz and provided with a large number of openings was interposed between the vaporizer 81 and the CVD reaction chamber 92. Further, a gate valve 95 was disposed between the gas rectifying plate 91 and the CVD reaction chamber 92. The reason for disposing the gate valve 95 is to transfer the source gas generated in the vaporizer 81 to the reaction chamber 92 without causing the retention of the source gas in the way, since the conductance of the rout of the source gas should desirably be as large as possible for that purpose.

A pipe 83 for bypass evacuation was connected to the vaporizer 81 in separate from the rout for the source gas-supply for exhausting the interiors of the carrier gas-introducing pipe 82 and the vaporizer 81. Further, a substrate 94 adapted to be heated by a heater 93 was positioned in the CVD reaction chamber 92 in such a manner that the substrate 94 faces the main surface of the gas rectifying plate 91. To this CVD reaction chamber 92 was connected a dry pump (not shown) via a pipe (not shown) for evacuating the CVD reaction chamber 92.

The CVD apparatus constructed as mentioned above was employed to perform the deposition of Cu thereby to examine the effects of this invention. The substrate for depositing Cu was prepared as follows. Namely, a silicon wafer 6 inches in diameter was thermally oxidized to form a silicon oxide film having a thickness of 100 nm. Then, a TiN film was deposited on the surface of the wafer as a Cu diffusion-preventing layer by way of sputtering. Then, the substrate 94 was placed in the CVD apparatus, and after the evacuation of the CVD reaction chamber 92, the substrate 94 was heated to 200° C.

Then, after the vaporizer 81 was sufficiently evacuated through the valve 26, the valve 26 was closed and the gate valve 95 was opened. At this moment, the vaporizer 81 was uniformly heated to 60° C. by means of a heater. The gas rectifying plate 91 was also heated to 65° C. by means of a heater installed in the gas rectifying plate 91. Then, 10 sccm of Ar gas was introduced into the reaction chamber via the pipe 82, the gas rectifying 91 and the gate valve 35.

When the pressure in the reaction chamber 92 was set to the normal state (0.15 Torr), the revolver 62 was allowed to rotate so as to allow the end portion of the cylinder 61 to coincide with the source-supplying port 64, thus allowing the cylinder 61 to be filled with the (Hfac)Cu(tmvs). Then, the cylinder 61 was further rotated by 180 degree so as to allow the end portion of the cylinder 61 to coincide with the high pressure gas-supplying port 67 as well as with the source ejection port 68, thus allowing the (Hfac)Cu(tmvs) to spout toward the vaporizer by the action of the Ar gas (the mass flow controller was set to 20 sccm) introduced in advance up to the high pressure gas-supplying port 67. At this moment, the pressure inside the CVD reaction chamber 92 was once increased up to about 3 Torr and then decreased immediately down to 1 Torr.

After retaining this gas-ejecting state for 10 seconds, the revolver 62 was further rotated by 180 degree so as to allow the cylinder 61 to take the liquid source-filling position again to be filled with the (Hfac)Cu(tmvs) again. Then, the revolver 62 was further rotated by 180 degree, thus repeating the ejection of the source in the same manner as explained above. This cycle of filling and ejecting of source was repeated eight times.

Figure 12:
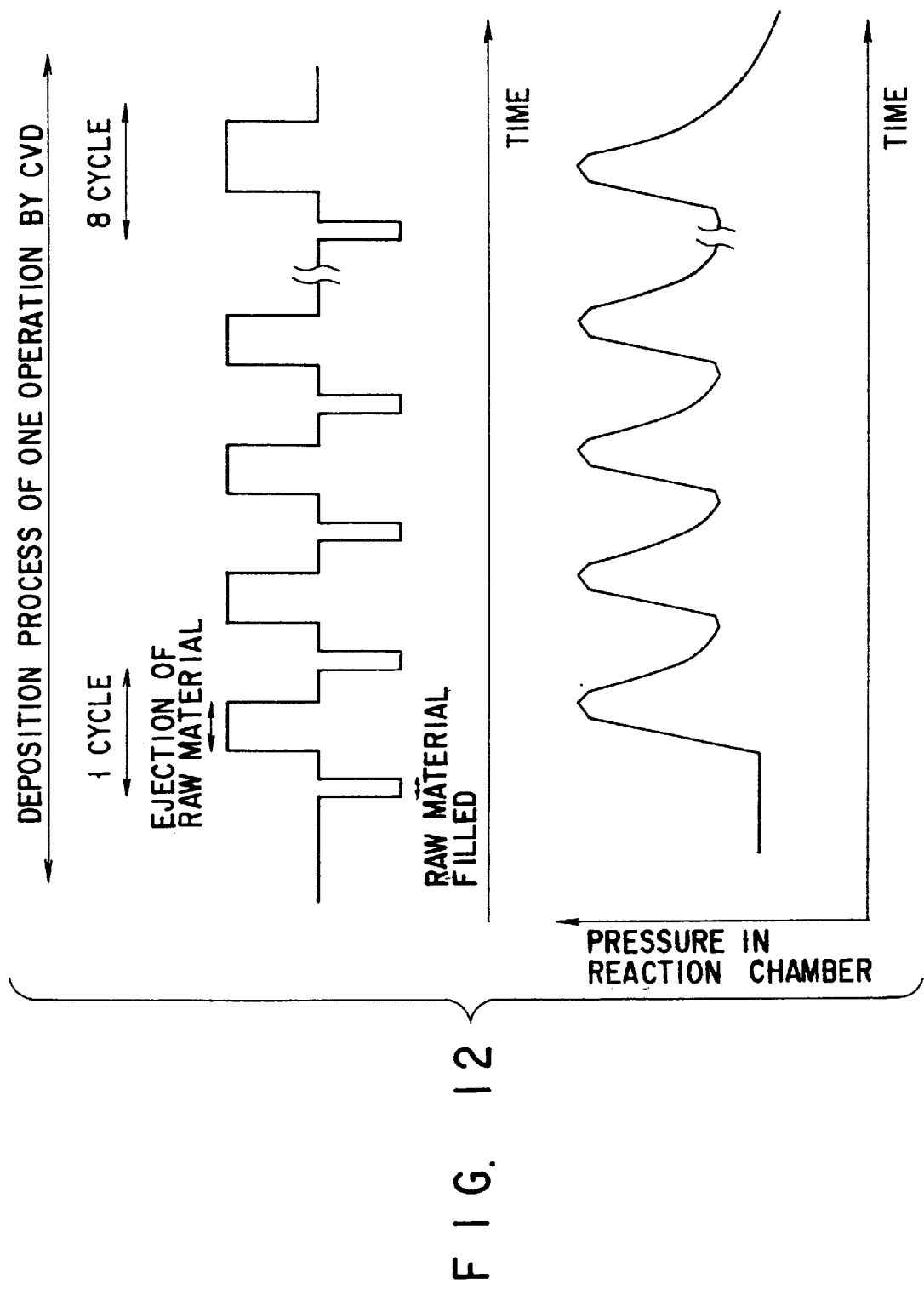
FIG. 12 is a graph showing a time table where the film formation of Cu is conducted using the CVD apparatus shown in FIG. 10.

Upon finishing the eighth ejection of source, the rotational position of the revolver 62 was kept in the liquid source-filling position, and the CVD reaction chamber 92 was evacuated until the pressure therein was lowered down to 0.3 Torr. Then, the gate valve 95 was closed finishing the operation of Cu deposition. Subsequently, the gate valve was closed and at the same time the evacuation of the vaporizer 81 was performed while introducing a carrier gas therein via the bypass line 83 until the preparation for the next Cu deposition on the substrate 94 was in order. The procedures explained above are one operation for accomplishing the film deposition. The time table for this one operation is shown in FIG. 12.

When the film thickness of the Cu film thus prepared was measured with a step prober, the film thickness was found to be about 400 nm. The time required for performing the eight times of source gas ejection was about 2 minutes, indicating almost the same degree of film deposition rate as that of the CVD method using the conventional source-supplying method.

Then, in order to demonstrate the possibility of controlling the film thickness of Cu film by adjusting the number of source gas ejection, the relationship between the film thickness of the deposited Cu film and the number of source gas ejection was examined, the results being shown in FIG. 13. As seen from FIG. 13, the film thickness of the deposited Cu film was linearly proportional with the number of source gas ejection, thus demonstrating the possibility of controlling the film thickness of Cu film by the adjustment of the number of source gas ejection. When the deposition of Cu was repeated under the same condition to examine the reproducibility of the Cu film thickness, the error in the film thickness was found to be ±10% or less. Therefore, it has been confirmed that it is possible, with the CVD apparatus and method of this invention, to assure the reproducibility in film thickness of Cu film and the stability of source gas supply.

Although the above example is explained by referring to the case where Ar carrier gas, Ar gas for ejection of source gas and (Hfac)Cu(tmvs) were employed in the deposition of Cu film, it is also possible to introduce a third gas in addition to these gases to the CVD reaction chamber. Further, it is also possible to obtain almost the same result even if other kinds of organic copper compound which are liquid at room temperature such as hexafluoroacetylacetonate bistrimethylsilyl acetylene copper or hexafluoroacetylacetonate trimethylsilylpropylene copper is employed as a source gas for Cu in place of the (Hfac)Cu(tmvs) employed in the above example. Moreover, even an organic compound which is solid at room temperature may be employed in this invention, provided that the organic compound can be liquefied by dissolving it into a suitable solvent.

EXAMPLE 10

This example explains one example where the CVD apparatus according to this invention is applied to the formation of an Al thin film. The same CVD apparatus as explained in Example 9 was employed and triisobutyl aluminum (TIBA) which is a CVD source for Al was employed in place of Cu. However, the vaporizer was not coated with Teflon coating. The preparation of a substrate was performed as follows. Namely, a silicon wafer 6 inches in diameter was thermally oxidized to form a silicon oxide film having a thickness of 100 nm. Then, a TiN film 30 nm in thickness was deposited on the surface of the wafer as a glue layer by way of sputtering. Then, the substrate 94 was placed in the CVD apparatus, and after the evacuation of the CVD reaction chamber 92, the substrate 94 was heated to 380° C. Then, the vaporizer was heated to 90° C. and the gas shower head and/or nozzle 91 was also heated to 150° C. Then, the cylinder was filled with the TIBA in the same manner as explained in Example 9, and the TIBA was introduced into the CVD reaction chamber by the action of the high pressure Ar gas. The Al film was deposited by repeating the cycle of filling and ejecting of the TIBA four times.

When the film thickness of the Al film thus prepared was measured, the film thickness was found to be about 450 nm. The time required for performing the four times of the TIBA ejection was about 1 minutes, indicating almost the same degree of film deposition rate as that of the CVD method for depositing Al film using the conventional source-supplying method.

When the relationship between the film thickness of the deposited Al film and the number of source gas ejection was examined by changing the number of the ejection, it was found that the film thickness of the deposited Al film was proportionally increased with the increase in number of source gas ejection, thus demonstrating the possibility of controlling the film thickness of Al film by the adjustments of the number of source gas ejection and the capacity of the cylinder. When the deposition of Al was repeated under the same condition to examine the reproducibility of the Al film thickness, the error in the film thickness was found to be ±10% or less. Therefore, it has been confirmed that it is possible, with the CVD apparatus and method of this invention, to assure the reproducibility in film thickness of Al film and the stability of source gas supply.

Although the above example is explained by referring to the case where Ar carrier gas, Ar gas for ejection of source gas and TIBA were employed in the deposition of Al film, it is also possible to introduce a third gas such as $H_2$ gas in addition to these gases to the CVD reaction chamber. Further, it is also possible to obtain almost the same result even if other kinds of organic aluminum compound whose viscosity in its liquid state is not so high and which can be transferred to the cylinder, such as dimethylethylamine alun (DMEAA), is employed as a source gas for Al in place of the TIBA employed in the above example. Moreover, even dimethylaluminum hydride (DMAH), etc. which is solid or too viscous at room temperature to be transferred may also be employed in this invention by suitably heating the transferring lines.

Next, another example of chemical vapor deposition apparatus which is capable of improving the operation rate of CVD apparatus will be explained. In this example, the improvement of the operation rate was effected by preventing the peeling of Cu film deposited on heated portions of the CVD apparatus, by preventing the contamination with the dust of wafer, and by minimizing the frequency of cleaning of the CVD apparatus.

This CVD apparatus generally comprises a CVD reaction chamber provided with a heating device for heating a substrate or wafer and with a wafer-holding device; a gas-supplying system for supplying CVD source gas, etc. to the CVD reaction chamber; and an evacuating system for exhausting a source gas, etc. from the reaction chamber. This CVD apparatus is also featured in that the surface portions inside the reaction chamber, which are heated intentionally or unintentionally, and are to be exposed to a source gas or the reaction products of the source gas, are covered with copper or a copper oxide.

Figure 14:
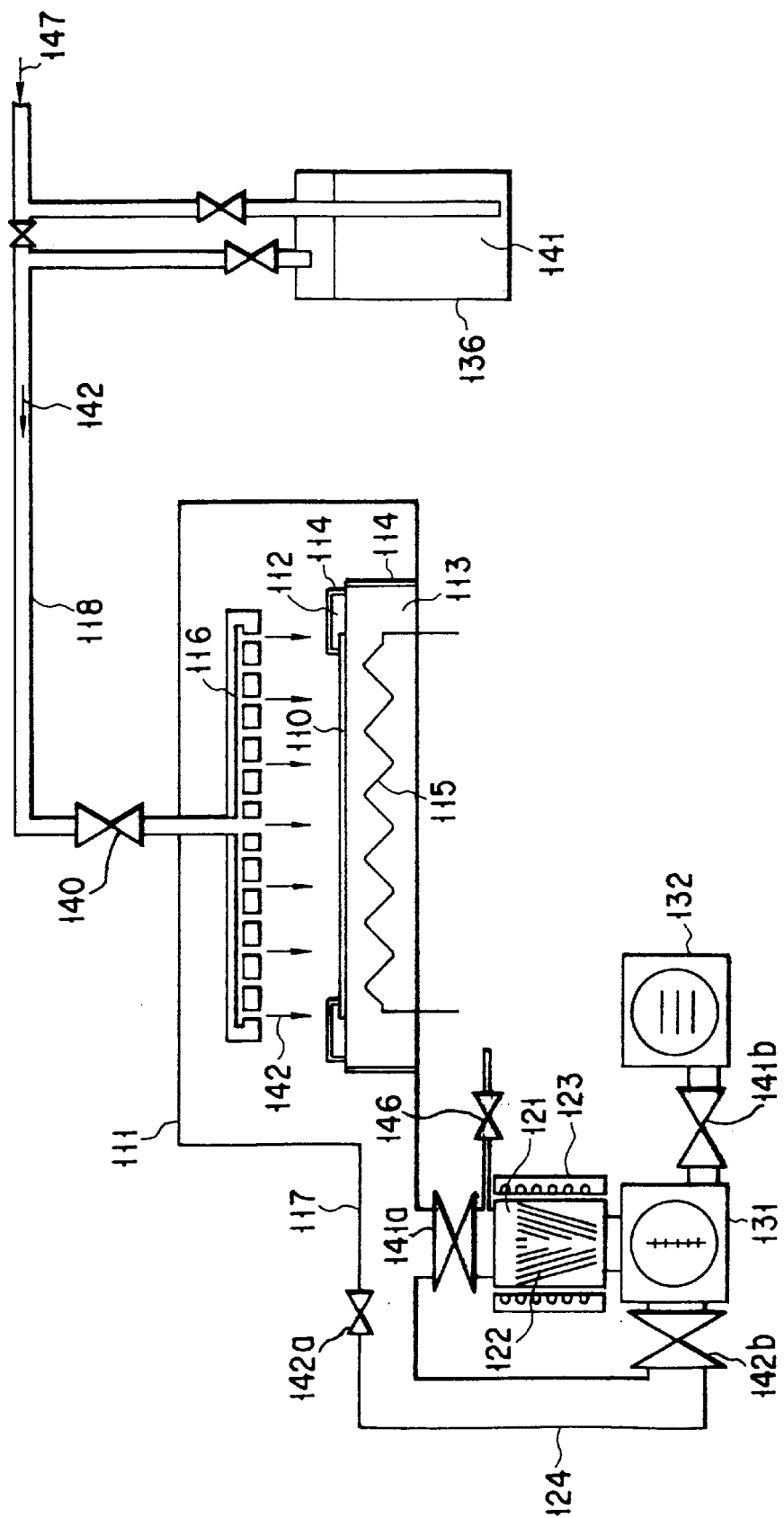
FIG. 14 schematically illustrates a CVD apparatus according to another example of this invention.

Specific examples of the surface portions which will be covered with copper or a copper oxide are a heating device for heating a wafer and a portion of the reaction chamber which is existed around the wafer to be placed in the reaction chamber. More specifically, referring to FIG. 14 showing a CVD apparatus, the surface portions which will be covered with copper or a copper oxide are; the upper surface and side wall of a holding ring 112 disposed for holding the wafer or for preventing the source gas from entering into the reverse surface of the wafer; and the upper surface and side wall of a heater table 113. In particular, since the holding ring is adapted to be contacted with a heated wafer during the CVD step, the chemical vapor deposition of Cu is most likely to take place on the holding ring among the whole areas in the reaction chamber excluding the wafer. Therefore, the Cu film deposited on the holding ring by the CVD is more likely to be peeled off, so that the coating of the surface of the holding ring with a copper thin film in advance is very effective in preventing such a peeling.

The deposition of such a Cu thin film is preferably performed by a physical vapor deposition (PVD) such as sputtering. This is because the Cu film deposited by means of PVD is more excellent in adhesion to the underlying layer as compared with that deposited by means of CVD. It is also possible to interpose a glue layer between the underlying layer and the Cu film. Examples of such a glue layer are nitrides of a refractory metal such as TiN, a refractory metal such as Nb and Ta. However, the glue layer may not necessarily be a barrier material which is frequently employed in the Cu wiring, but may be a metal which is capable of improving an adhesion between the underlying layer and Cu, specific examples thereof being Al and Ti.

There are two reasons for covering the surface of the deposition apparatus with Cu in advance as explained below.

(1) Since the CVD-Cu film which will be deposited unintentionally on a surface of the apparatus is poor in adhesion with the underlying layer, the CVD-Cu film would be easily stripped away as the film thickness thereof is increased. By contrast, when the surface of the apparatus is coated thereon with a Cu film which is relatively excellent in adhesion with the underlying layer, the CVD-Cu film is now deposited on this coated Cu film so that the adhesion of the CVD-Cu film to the surface of the apparatus is improved as compared with where the CVD-Cu film is directly deposited on the surface of the apparatus, thus making the peeling of the CVD-Cu film more difficult.

(2) When the surface of the apparatus is covered in advance with a Cu film which is excellent in surface smoothness, the surface smoothness of the CVD-Cu film deposited on this Cu film is naturally improved as compared with that where the CVD-Cu film is directly deposited on the surface of the apparatus.

The surface smoothness of a CVD-Cu film is gradually improved as the deposition of Cu film proceeds (increase in film thickness), and becomes optimum at certain point of the Cu deposition. However, when the deposition of Cu film proceeds beyond this optimum point, the surface smoothness of the Cu film will be deteriorated. The reason of gradual improvement in surface smoothness of Cu film in the initial stage of the Cu deposition may be ascribed to the fact that when the Cu-CVD is performed, the nuclei of Cu are generated at first, and then these nuclei of Cu coaescence with each other, thus growing into a shape of island as the deposition of Cu is further proceeded, the islands being ultimately grown into a Cu film covering the surface of a substrate.

When the deposition of Cu is continued, the Cu film forming a continuous film is caused to grow further with the surface smoothness thereof being kept for a while, but subsequently a secondary nucleus of Cu is caused to generate on this continuous Cu film. This secondary nucleus of Cu is then grown into a larger particle thus gradually deteriorating the surface smoothness of Cu film. The Cu particles grown from the secondary nucleus can be easily peeled off to become dust, thus contaminating the surface of the wafer. Therefore, it is desirable that even if the film thickness of Cu film is increased, the surface smoothness of the Cu film is not deteriorated.

In the case of a CVD-Cu film growing on the surface of the apparatus covered in advance with Cu however, the CVD-Cu film is now deposited on a smooth surface of the underlying layer of the same material, so that the growth of deposited Cu into an island shape at the initial stage of the deposition as mentioned above can be disregarded. Therefore, the surface smoothness of the underlying Cu film can be maintained even if the film thickness of Cu film is increased in the progress of Cu deposition. Accordingly, the generation of the secondary nucleus of Cu as well as the generation of dust can be minimized as compared with the case where the CVD-Cu film is directly deposited on the surface of the apparatus. It is possible to employ Cu containing a trace of oxygen or Cu oxide in place of pure Cu as a material for preliminarily covering the surface of apparatus. The Cu containing a trace of oxygen or Cu oxide mentioned above may be the one which has been deposit as a pure Cu, but the surface of the Cu is subsequently oxidized intentionally or unintentionally.

The controlling in crystallinity of the Cu film covering the wafer-holding ring 112 is preferable in this invention in view of further improving the surface smoothness of the CVD-Cu film to be deposited on this underlying Cu film. Specifically, the wafer-holding ring is manufactured from a monocrystalline material, and then a monocrystalline Cu film is epitaxially grown thereon, thus preparing a wafer-holding ring covered with a monocrystalline Cu film. The reason for this improvement in surface smoothness that can be achieved by the employment of monocrystalline Cu as an underlying layer as compared with the case where a polycrystalline Cu film is deposited as an underlying layer may be explained as follows.

The deposition rate in the CVD is generally altered depending on the crystal orientation of Cu. Therefore, when the underlying Cu film is of polycrystal, the growth rate in thickness-wise of Cu film is altered depending on the crystal orientation of each single crystal constituting the polycrystal. Accordingly, with the increase in film thickness, the ruggedness of the surface may become more conspicuous to deteriorate the surface smoothness, thus ultimately giving rise to the generations of aforementioned secondary nuclei and particulate Cu growth. By contrast, when the underlying Cu film is of monocrystal, the CVD-Cu film to be deposited thereon is expected to grow in the form of monocrystal. Therefore, the fluctuation of growth rate in thickness-wise of Cu depending on the location in the surface of the underlying layer would not be caused to occur, thus making it possible to minimize the deterioration of surface smoothness.

It is also preferable in formation of a monocrystalline Cu film as an underlying layer to manufacture the wafer-holding ring with a monocrystalline alumina (sapphire). In this case, the deposition of monocrystalline Cu through an epitaxial growth can be performed by suitably selecting the crystal plane of the depositing surface of the wafer-holding ring as the sapphire is cut into the shape of the wafer-holding ring. For example, when the <024> of sapphire is selected as the depositing surface, the deposition of Cu(100) monocrystal can be performed.

As for the material for the wafer-holding ring, any kind of material can be used as far as the epitaxial growth of Cu can be performed thereon and at the same time it does not raise any structural problem as a material for the wafer-holding ring. As for the method of forming a Cu coating, it is possible to employ other methods as far as they are capable of effecting an excellent adhesion to the material to be deposited. For example, a plating method can be employed. The surface portions of the wafer-holding ring which will be exposed to the source gas or reaction products of the source gas may be covered not only by the deposition, but also by using a bulk of copper or copper oxide.

Next, another embodiment of this invention will be explained as follows. The CVD apparatus according to this invention is constructed for improving the removal of reaction products resulting from the reaction of the CVD source gas, and generally comprises a CVD reaction chamber provided with a wafer-holding device; a gas-supplying system for supplying CVD source gas, etc. to the CVD reaction chamber; and an evacuating system for exhausting a source gas, etc. from the reaction chamber. This CVD apparatus is also featured in that a source reaction surface that can be heated is disposed on at least one place between a vacuum pump constituting the aforementioned evacuation system and the chemical vapor deposition chamber, and that the source reaction surface is covered with copper or a copper oxide.

Specific example of the source reaction surface that can be heated and is covered with copper or a copper oxide in the CVD apparatus according to this invention is a device 121 shown in FIG. 14. More specifically, the source reaction surface is disposed in a piping mounted to connect the reaction chamber and the vacuum pump, and provided therein with a heater for heating the source reaction surface. A bivalent copper compound resulting from the Cu-CVD reaction is caused to decompose on the reaction surface constituted by copper or copper oxide, i.e. $(Hhac)_2Cu$ for example is caused to decompose into Cu and other constituent components on the reaction surface constituted by copper or copper oxide, hence any solid reaction products are prevented from entering into the downstream side of exhausting system where a vacuum pump, etc. is disposed, thus preventing the damage of the vacuum pump, etc.

The reasons for forming the reaction surface with copper or copper oxide are as follows. Namely, the surface of copper or copper oxide acts catalytically on the decomposition of $(Hhac)_2Cu$, so that Cu can be more easily precipitated from $(Hhac)_2Cu$ on the surface of copper or copper oxide than on the surface of other material. As a result, most of the $(Hhac)_2Cu$ that might be re-aggregated into a solid is consumed so that most of reaction products flowing downstream from the reaction surface are gaseous (Hfac) and (Hfac) decomposition products.

Since copper oxide is excellent in catalytic capacity, the reaction surface should preferably be formed with copper oxide. Another reason for employing copper or copper oxide as a reaction surface is that since the reaction surface is deposited only with copper so that even if the reaction surface is used for a long period of time, the reaction surface is always constituted by copper or copper oxide. If the reaction surface is maintained in a state of copper oxide, it can be easily realized by flowing a little amount of oxygen over a heated reaction surface in every occasion when wafer processing is to be performed.

If the efficiency for removing the $(Hhac)_2Cu$ is desired to be improved, the surface area of the reaction surface should be enlarged as much as possible within the range where a sufficient exhaustion conductance can be assured. This can be realized by superimposing a plurality of cone shaped reaction surfaces as shown in FIGS. 15A to 15C, or by employing a porous body as shown in FIG. 16.

The operation temperature of the reaction surface should preferably be in the range of 200 to 350° C. Because if the operation temperature is set within this range, a sufficient degree of copper precipitation rate on the reaction surface can be achieved thus improving the solid material-removing capacity, and at the same time the entrapment of impurities resulting from the decomposition of (Hfac) by the copper deposited on the reaction surface can be avoided. If the capacity for removing the solid material is desired to be improved, the reaction surface should be heated as high as possible within the temperature range mentioned above.

The reaction products-removing apparatus according to this invention can be applied in addition to the above example to any other places. For example, the apparatus can be disposed between a piping mounted to purge a region to be exposed to a source of high density (such as a source storage tank or a source gas-supplying system) and a vacuum pump thereby to remove any solid reaction products, thus preventing the damage of the vacuum pump.

In the above description, the explanation is mainly centered on a chemical vapor deposition apparatus for depositing copper. However, the idea of employing a metal to be deposited by the CVD or an oxide of such a metal as a coating metal or as reaction surface according to this invention can be also applied to any other chemical vapor deposition apparatus for depositing other kind of metal by making the most of the same kind of chemical reaction as explained above. For example, this invention is applicable to a chemical vapor deposition apparatus making use of a source gas comprising (Hfac) radical and Au atom. In particular, when the CVD of expensive noble metals is to be performed, the recovery of noble metals in high purity can be easily performed by employing this invention.

In the followings, a specific example of a chemical vapor deposition apparatus whose reaction chamber is covered on its surface with copper or copper oxide will be explained.

EXAMPLE 11

FIG. 14 schematically illustrates a CVD apparatus according to another example of this invention. The purpose of this example is to illustrate a method of improving the adhesion of Cu film which has been deposited unintentionally on a heated portion of a Cu-CVD reaction chamber, thus preventing the stripping of a deposited film.

This apparatus comprises essentially a CVD reaction chamber 111 for depositing Cu on a wafer by means of chemical vapor deposition method, a gas-supplying system for supplying a source gas to the CVD reaction chamber and an evacuating system for exhausting a source gas from the reaction chamber. The CVD reaction chamber is a cold wall type CVD apparatus comprising a heater 115 for heating a wafer 110, a supporting table 113 for sustaining the heater and wafer, a holding ring 114 for preventing a CVD source from entering into the reverse surface of the wafer, and a gas rectifying plate 116 for uniformly supplying a source gas to the surface of the substrate.

The gas-supplying system comprises a storage tank 141 for storing a liquid Cu-CVD source, a piping for delivering an inert gas 147 for gasifying the CVD source in the storage tank by way of bubbling, and a piping 118 for transferring the gasified source gas 142 to the reaction chamber. The evacuating system comprises a main pump for evacuating the reaction chamber up to a high vacuum, and an auxiliary pump 132. The construction mentioned above was of a thermal CVD apparatus of common type. The Cu coating 114 which is one of the features of this invention was performed on the upper surface and side wall of the holding ring 112, and on the outer circumference of the heater-supporting table 113. The Cu coating was performed by means of sputtering. The holding ring was made of quartz and the heater-supporting table was made of stainless steel.

Experiments of depositing a Cu film by means of CVD using a chemical vapor deposition apparatus explained above was performed as follows. As a CVD source 136, $(Hfac)Cu(tmvs)$: $\{[(CF_3CO)_2CH]Cu(C_5H_{12}Si)\}$ which is a monovalent copper compound was employed. A substrate comprising a silicon wafer on which a thermal oxide film having a thickness of 100 nm was formed was employed for depositing Cu. Then, a Ti thin film 30 nm in thickness and a TiN thin film 60 nm in thickness was formed by way of sputtering on this substrate. This wafer was placed on a heater, arranging the TiN surface thereof to face the gas rectifying plate 116. The outer circumference of the wafer was fixed on the heater by pressing the upper surface of the wafer with the holding ring.

Then, the CVD reaction chamber was evacuated up to the order of $10^{-4}$ Pa, and subsequently the temperature of the upper surface of the wafer was controlled to 180° C. by the heater. When the temperature of the wafer was made constant, the storage tank was heated to about 70° C. to raise the vapor pressure of the CVD source, and a bubbling of the CVD source was performed by using Ar gas, the resultant mixed gas comprising the source gas and Ar gas was introduced into the CVD reaction chamber. The supply of the source gas was continued for two minutes. The initiation and suspension of the supply of source gas were performed by means of a valve 40. As a result, a Cu film about 400 nm in thickness was deposited on the wafer (TiN). At this moment, the surface temperature of the wafer-holding ring was increased to about 160° C., and the deposition of Cu film about 150 nm in thickness was found to have been deposited in one CVD operation on the surface of the Cu-covered substrate prepared in advance.

The surface of the holding ring thus treated with the CVD was found as being mirror surface, thus maintaining the original mirror surface of the holding ring. The peeling of the deposited Cu film from the holding ring was not admitted at all. A small amount of Cu deposition was admitted on the side wall of the heater-supporting table though the amount of the Cu deposition varied depending the region thereof. Namely, the highest deposition of Cu was found at a region of the heater-supporting table which was nearest to the holding ring, the amount of Cu deposition being almost the same level as that on the holding ring. No peeling of Cu deposition was admitted at this portion.

Then, the Cu film deposition was performed on a large number of wafers by way of the CVD using a CVD apparatus of this invention to confirm the peeling of the Cu film deposited unintentionally on the inner surface of the CVD apparatus. 60 pieces of 6-inch wafers were deposited respectively with Cu film 400 nm in thickness at a temperature of 180° C. by means of the CVD. Subsequently, the interior of the CVD apparatus was observed to confirm a large amount of Cu film deposition on the wafer-holding ring and on the side wall of the heater-supporting table. When the thickness of the Cu film deposited on the wafer-holding ring was measured, the film thickness thereof was found as being about 10 $\mu$m thick. Any peeling of the Cu film deposited on the wafer-holding ring was not admitted though the Cu film was cloudy in color. Any peeling of the Cu film deposited on the wafer-holding ring was not admitted also in a peeling test using a tape (Scotch mending tape, R810, Sumitomo 3M Co.), indicating an excellent adhesion between the Cu film and the wafer ring.

On the other hand, as a comparative example, the same experiment as explained above was performed except that the wafer-holding ring was not deposited with a Cu film. The wafer-holding ring employed in this experiment was made of quartz. The reason for selecting quartz is that an insulating material such as quartz generally indicates a deposition selectivity so that a CVD deposition can not be easily effected on the surface of quartz as compared with the surface of the wafer. In the same manner as aforementioned example, the wafer was heated to 180° C., and after depositing a Cu film to a thickness of 400 nm, the interior of the CVD apparatus was observed to confirm a Cu film deposition about 100 nm in thickness on the wafer-holding ring. Any peeling of the Cu film deposited on the wafer-holding ring was not admitted at this moment, but the deposition selectivity of the quartz was not admitted also.

In the same manner as explained in the above experiment, 60 pieces of 6-inch wafers were deposited respectively with Cu film 400 nm in thickness at a temperature of 180° C. by means of the CVD. Subsequently, the interior of the CVD apparatus was observed to confirm a large amount of Cu film deposition on the wafer-holding ring and on the side wall of the heater-supporting table. The Cu film deposited on the wafer-holding ring was of a reddish cloudy film as compared with the bulk Cu, and part of the Cu film was found peeled.

The partial peeling was also admitted on the side wall of the heater-supporting table, and the falling of the stripped Cu on the bottom of the CVD reaction chamber was also admitted. It is highly probable that this stripped Cu film becomes dust and contaminates the surface of the wafer to be treated in the CVD apparatus, thus raising a problem. When the adhesion of the Cu film deposited on the wafer-holding ring was evaluated in a peeling test as in the case of the above example, the Cu film could be easily stripped away in the form of a foil, thus indicating a poor adhesion.

It will be clear from the above results that even if a Cu film large in thickness is deposited unintentionally on a heat portion inside the CVD reaction chamber, the peeling of such a Cu film can be prevented by employing the CVD apparatus of this invention. Therefore, the frequency of periodical maintenance for cleaning the interior of the CVD reaction chamber can be minimized, thus improving the operation rate of the CVD apparatus.

EXAMPLE 12

FIGS. 17A to 17C schematically illustrate a wafer-holding ring in a CVD apparatus according to another example of this invention. The purpose of this example is to illustrate a method of improving the adhesion of Cu film which has been deposited unintentionally on a wafer-holding ring of a Cu-CVD reaction chamber, thus preventing the stripping of a deposited film, and at the same time improving the surface smoothness of the Cu film to be deposited on the wafer-holding ring so as to minimize the generation of dust resulting from the deterioration in surface smoothness of the Cu film.

FIG. 17A illustrates a wafer-holding ring 152 made of single-crystalline alumina on the surface of which a single-crystalline Cu film 151 about 400 nm in thickness is deposited. The formation of the single-crystalline Cu film was performed as follows. The plane orientation of the single-crystalline alumina was treated such that the surface of the holding ring becomes hexagonal $Al_2O_3$ (024) plane. The deposition of Cu film was performed while heating this single-crystalline alumina at a temperature of 400° C. by means of sputtering thereby depositing a (100) single-crystalline Cu film about 400 nm in thickness. FIG. 17B illustrates a wafer-holding ring 151 made of quartz whose upper surface and side wall is deposited by means of sputtering with a Cu film about 400 nm in thickness. In this case, the Cu film is a polycrystalline film mainly comprising Cu (111) crystal grain and Cu (100) crystal grain. FIG. 17C illustrates a wafer-holding ring of the conventional type which is made of quartz.

These three wafer-holding rings were disposed in the CVD reaction chamber, and the depositing of a large number of Cu films was performed by means of CVD. Then, the adhesion of the resultant Cu film deposited on the wafer-holding ring was observed. The deposition conditions of the Cu film in the CVD were the same as in Example 10. Namely, the thermal CVD was performed setting the temperature of the wafer to 180° C., thereby depositing a Cu film on each of the wafer. As a CVD source, (Hfac)Cu(tmvs) was employed. When the deposition of 60 pieces of 6-inch wafers was completed, the deposition of a single-crystalling Cu film about 10 μm in thickness on the wafer-holding ring as shown in FIG. 17A was confirmed. When adhesion of the Cu film deposited by the CVD to the wafer-holding ring was evaluated in a peeling test using a tape (Scotch mending tape, R810, Sumitomo 3M Co.), any peeling of the Cu film was not admitted, indicating an excellent adhesion between the Cu film and the wafer ring.

Likewise, when the deposition of 60 pieces of 6-inch wafers was completed, the deposition of a polycrystalling Cu film about 10 μm in thickness on the wafer-holding ring as shown in FIG. 17B was confirmed. When adhesion of the Cu film deposited by the CVD to the wafer-holding ring was evaluated in a peeling test using a tape (Scotch mending tape, R810, Sumitomo 3M Co.), any peeling of the Cu film was not admitted as in the case of the holding ring shown in FIG. 17A, indicating an excellent adhesion of the Cu film.

Meanwhile, when the deposition of 60 pieces of 6-inch wafers was completed by making use of the conventional wafer-holding ring shown in FIG. 17C, the deposition of a polycrystalling Cu film about 10 μm in thickness on the wafer-holding ring as shown in FIG. 17B was admitted. But part of the Cu film was found peeled. When adhesion of the Cu film to the wafer-holding ring was evaluated in a peeling test using a tape (Scotch mending tape, R810, Sumitomo 3M Co.), the peeling of the Cu film in the form of foil was admitted. As seen from above experiments, the prevention of the peeling of a Cu film which has been deposited on a wafer-holding ring after the treatment of a large number of wafers can be effectively achieved by covering the wafer-holding ring with a polycrystalline or single-crystalline Cu film according to this invention.

Then, these three wafer-holding rings were disposed in the CVD reaction chamber, and the depositing of a large number of Cu films was performed by means of CVD. Then, the surface smoothness of the resultant Cu film deposited on the wafer-holding ring was observed. The deposition conditions of the Cu film in the CVD were the same as in Example 10. Namely, the thermal CVD was performed setting the temperature of the wafer to 180° C., thereby depositing a Cu film on each of the wafer. As a CVD source, (Hfac)Cu(tmvs) was employed. In the middle of the deposition treatment of 60 pieces of 6-inch wafers, the wafer-holding ring was taken out from the reaction chamber and the surface smoothness of the Cu film deposited on the wafer-holding ring was evaluated by measuring the light reflectance of the Cu film. The wavelength of light employed in this measurement of reflectance was 720 nm.

Figure 18:
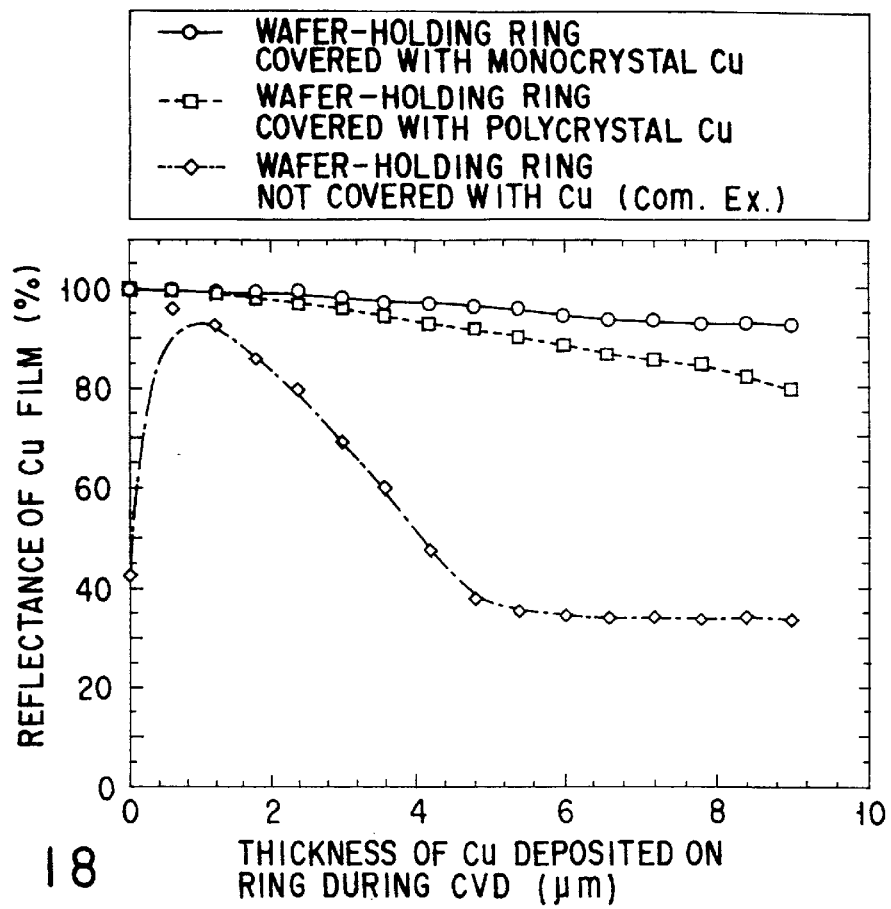
FIG. 18 is a graph showing a relationship between the film thickness of Cu deposited on each of three kinds of wafer-holding rings and the reflectance of the Cu film.

FIG. 18 shows a relationship between the film thickness of Cu deposited on each of three kinds of wafer-holding rings and the reflectance of the Cu film. In this FIG. 18, a copper film 400 nm in thickness, having a mirror-surface and formed via sputtering at room temperature on a TiN layer 600 nm which was deposited on a Si wafer via sputtering was assumed as being 100% in reflectance.

As seen from FIG. 18, a decrease in reflectance resulting from the increase in film thickness is minimum in the case of a wafer-holding ring covered with a single-crystalline Cu film. Namely, as compared with other two kinds of wafer-holding rings, the surface smoothness of the Cu film can be kept relatively excellent even if the Cu film deposited becomes larger. On the other hand, in the case of a wafer-holding ring covered with a polycrystalline Cu film, the reflectance of the Cu film is also high and the surface smoothness thereof can be effectively maintained even if the Cu film deposited becomes larger, when it is compared with the Cu film deposited on the conventional wafer-holding ring which is not covered with a Cu film, though these properties are somewhat inferior as compared with the case where a wafer-holding ring is covered with a single-crystalline Cu film.

As explained above, even if the film thickness of a Cu film deposited on a wafer-holding ring during the CVD processing is increased, the surface smoothness of the Cu film can be kept excellent by employing a method wherein a Cu film deposited in advance on the wafer-holding ring. Accordingly, it is possible to inhibit the generation of dust resulting from the peeling of the Cu film, thus falling of Cu fine particles that will be brought about by the deterioration in surface smoothness of the Cu film. In particular, if a single-crystalline Cu film is employed for covering the wafer-holding ring in advance, an excellent surface smoothness of the Cu film can be kept maintained.

EXAMPLE 13

The purpose of this example is to illustrate an apparatus and a method of effectively removing bivalent copper compound to be generated by a CVD reaction when monovalent copper compound is employed as a source gas in a Cu-CVD method.

As shown in FIG. 14, the apparatus for removing bivalent copper compound according to this example is disposed between a CVD reaction chamber 111 and a main pump 131 mounted for evacuating the CVD reaction chamber. The apparatus for removing bivalent copper compound (hereinafter referred to simply as a bivalent copper-removing apparatus) comprises as shown in FIG. 15 a large number of reaction surfaces 122, each being made of copper and having a cone shape. This reaction surface is adapted to be heated by a heater disposed outside the bivalent copper-removing apparatus. The deposition of Cu was performed using a thermal CVD apparatus provided with the bivalent copper-removing apparatus. In this case, As a CVD source, (Hfac)Cu(tmvs) which is a monovalent copper compound was employed. A substrate comprising a silicon wafer on which a thermal oxide film having a thickness of 100 nm was formed was employed for depositing Cu. Then, a Ti thin film 30 nm in thickness and a TiN thin film 60 nm in thickness was formed by way of sputtering on this substrate.

This wafer was placed in the CVD reaction chamber, and after valves 142a, 142b and 141b were opened, the interior of the CVD reaction chamber was evacuated up via exhaust lines 117 and 124 to the order of 10–4 Pa by actuating a main vacuum pump (a turbo-molecular pump) 131 and an auxiliary pump (a dry pump) 132. Then, the temperature of the wafer was set to 180° C., valves 142a and 142b were closed, and a conductance variable valve 141a was opened so as to interpose the bivalent copper-removing apparatus in the exhaust rout. Then, the reaction surface 122 of the bivalent copper-removing apparatus was heated to 250° C. by a heater 123. Subsequently, the valve 146 was opened to introduce $O_2$ gas at a flow rate of 30 sccm into the bivalent copper-removing apparatus.

Subsequently, the CVD source was introduced into the CVD reaction chamber by opening the valve 140 to perform CVD reaction. After the deposition of a Cu film about 2 μm thickness was effected on the wafer, the introduction of the source gas was suspended by closing the valve 140. Then, CVD reaction chamber was evacuated via the bivalent copper-removing apparatus to a vacuum degree of 10–2 Pa upon which the valve 141a was closed, and the valves 142a and 142b were opened again so as to continue the evacuation of the reaction chamber until the vacuum degree of the reaction chamber reached to the order of $10^{-4}$ Pa, and at the same time the heater 123 was cooled to room temperature. As a result, during the time period when the source gas was continued to be supplied as well as for a certain period of time after the supply of source gas was suspended, the source gas discharged from the reaction chamber as well as the reaction products thereof were all passed through the bivalent copper-removing apparatus 121 to be mixed with $O_2$ therein and then allowed, while being contacted with the heated reaction surface made of copper, to flow into the vacuum pump.

After the operation of the CVD apparatus was suspended, the exhaust system thereof was disintegrated, and an observation was performed on the interior of each of the CVD reaction chamber 111, the piping 117 and 124, the bivalent copper-removing apparatus 121 and the inlet port of the main pump 131 to examined the effects of bivalent copper-removing apparatus 121. As a result, the presence of the characteristic green solid crystal which is indicative of the presence of a bivalent Cu compound: (hfac)2Cu resulting from the CVD reaction of monovalent (hfac)Cu(tmvs) was not recognized anywhere of these members, but a Cu thin film which was considered to have been deposited during the CVD was admitted on the reaction surface 122 in the bivalent copper-removing apparatus 121. Consequently, it has been confirmed that it is possible with the use of this removing apparatus to prevent the bivalent copper compound (which is more likely to be generated when a monovalent copper compound is used as a CVD source gas) from precipitating as a solid minute crystal in the exhaust system, and at the same time to prevent the solid minute crystal from adhering onto the vanes of a turbo-molecular pump for example thereby to cause a trouble of the pump.

In the above example, the reaction surface made of copper was employed. However, since the reaction surface is heated in an oxidative atmosphere, the surface of thereof is actually oxidized. Further, although the Cu resulting from the decomposition of the bivalent copper compound will be deposited on the reaction surface, the Cu will be immediately oxidized upon being heated in the oxidative atmosphere. Therefore, the reaction surface according to this invention is featured in that it is turned into a copper oxide or a copper containing oxygen at least during the operation of the bivalent copper-removing apparatus. The reaction surface may be also formed of a copper oxide from the beginning.

The shape of the reaction surface in the bivalent copper-removing apparatus is not restricted to that described in FIG. 15. Namely, the reaction surface may be any shape as far as the surface area thereof is sufficiently large for the removal of a large amount of the solid reaction products, and it is capable of attaining a sufficient exhaustion rate required for setting the pressure in the CVD reaction chamber. For example, it may be a columnar body made of copper or copper oxide and provided therein with a large number of through holes as shown in FIG. 16.

On the other hand, as a comparative example, the exhaust of the CVD reaction chamber shown in FIG. 1 during the Cu-CVD was performed directly by actuating the vacuum pump by way of the piping 124 without allowing the reaction gas to pass through the bivalent copper-removing apparatus. Then, after allowing the deposition of Cu film about 2 μm in thickness on the wafer as in the case of the above example, the interior of each of the CVD reaction chamber, exhaust system and main pump was observed, finding the adhesion of green particles about 0.3 mm in diameter on the inner surfaces of the piping and the pump.

These solid materials thus precipitated were considered to be bivalent Cu compound (hfac)$_2$Cu from the color thereof. In this case, if the deposition of Cu by means of CVD is continued, the accumulation of this precipitated product as mentioned above would be continued to increase, thus ultimately damaging the pump. It may be possible to reduce the precipitation of the bivalent copper compound by heating of the aforementioned piping and turbo-molecular pump. However, even if such a heating is performed, another accumulation of precipitated products would be caused at the downstream side, thus failing to solve the problem.

EXAMPLE 14

The purpose of this example is to illustrate an embodiment where the removing apparatus for the Cu-CVD explained in the above Example 13 was applied to a different portion of the CVD apparatus.

The source supply lines for delivering Cu-CVD source gas from the storage tank to the CVD reaction chamber is generally heated to 50 to 100° C. in view of preventing coagulation of source gas. However, this heating may stimulate the disproportionation wherein a portion of the source gas (monovalent copper compound) is changed into a bivalent copper compound, hence the resultant bivalent copper compound is more likely to be accumulated in the pipes disposed for supplying a source. The accumulation of this bivalent copper compound may enter into a vacuum pump disposed for exhausting the source supply lines, thus troubling the vacuum pump, or flow into the CVD reaction chamber thus adhering onto a wafer and causing the generation of dust.

Figure 19:
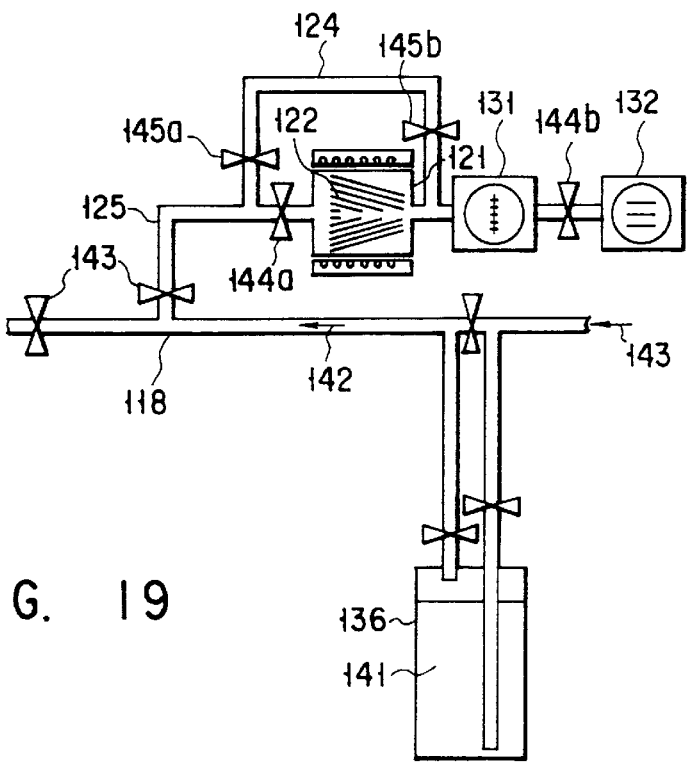
FIG. 19 is a sectional view schematically showing a CVD apparatus provided with a device for removing Cu-CVD reaction products.

In order to solve these problems, the bivalent copper-removing apparatus 121 of this invention is placed as shown in FIG. 19 in the midway of the piping 125 disposed for evacuating the CVD source gas-supplying lines. The operation of the bivalent copper-removing apparatus 121 can be performed as follows. Namely, the valve 143 was closed to terminate the Cu-CVD. Then, the inlet and outlet valves of the storage tank were closed to suspend the inflow of the source gas to the supplying lines. Then, the reaction surface 122 of the bivalent copper-removing apparatus was heated to 250° C. and the valve 146 was opened to introduce $O_2$ gas at a flow rate of 10 sccm into the bivalent copper-removing apparatus.

Subsequently, the valves 143, 144a and 144b were opened, and the piping for the source gas supply lines was evacuated via the bivalent copper-removing apparatus. In this occasion, in order to prevent the $O_2$ gas introduced into the bivalent copper-removing apparatus from returning into the source gas supply lines, the exhaustion should preferably be performed while purging he source gas supply pipe with a sufficient flow rate of an inert gas such as Ar gas 147. When an observation was performed on the interior of each of the source gas pipe 118, the exhaust pipe 125 and the pump 131 after the above exhaustion was continued for 5 minutes, the presence of the characteristic green solid crystal which is indicative of the presence of a bivalent Cu compound was not recognized.

As explained above, this removing apparatus for the Cu-CVD can be applicable not only to the exhaust lines of the CVD reaction chamber, but also to other portions of the CVD apparatus which is adapted to be exposed to the CVD source gas, such as the source-supplying lines, for effectively removing the bivalent copper compound to be generated in these portions of the CVD apparatus.

It is possible with the employment of the chemical vapor deposition apparatus of this invention to prevent a Cu film deposited unintentionally on a surface of members other than the wafer in the reaction chamber from being peeled off, thus minimizing the generation of dust and therefore to minimize the frequency of cleaning operation of the interior of the apparatus. As a result, the operation rate of a chemical vapor deposition apparatus as well as the industrial productivity can be improved as compared with the conventional apparatus.

Further, it is possible with the employment of the chemical vapor deposition apparatus of this invention to effectively remove solid reaction products resulting from the reaction of a CVD source gas before these solid reaction products enter into a vacuum pump, thus making it possible to avoid the troubling of the pump, resulting in the improvements of the operation rate of a chemical vapor deposition apparatus and of the industrial productivity as compared with the conventional apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A method of manufacturing a semiconductor device comprising the steps of:

forming an insulating layer on a substrate;

forming a groove in the insulating layer;

forming an intermediate thin film, which is either one of a diffusion preventing thin film or a glue thin film, on a surface of the insulating layer and on an inner surface of the groove;

performing a first vapor deposition by supplying a source gas comprising a copper-containing organometallic compound and an oxidizing gas over the intermediate thin film, thereby to allow a first conductive thin film containing copper as a main component and a trace of oxygen to be grown through a chemical vapor deposition;

performing a second vapor deposition by supplying the source gas without supplying the oxidizing gas, thereby to allow a second conductive thin film mainly containing copper to be grown through a chemical vapor deposition; and removing those portions of the intermediate thin film, the first conductive thin film and the second conductive thin film which are on the insulating layer except in the groove, thereby forming a wiring layer consisting essentially of the first conductive thin film and the second conductive thin film in the groove.

2. The method according to claim 1, wherein said intermediate thin film is selected from the group consisting of refractory metals; nitrides of refractory metals; silicides of refractory metals; and a ternary alloy comprising a refractory metal, Si and N.

3. The method according to claim 2, wherein said refractory metal is selected from the group consisting of Nb, Ta, Ti and W.

4. The method according to claim 1, wherein said oxidizing gas is selected from the group consisting of oxygen gas, ozone and water.

5. The method according to claim 1, wherein the temperature of the substrate at said first and second vapor depositions is 200° C. or lower.

6. The method according to claim 1, wherein said organic copper compound is of a molecular structure having Lewis base linked via oxygen atom to copper atom.

7. The method according to claim 6, wherein said organic copper compound is a β-diketonate compound.

8. The method according to claim 1, wherein said first conductive thin film has a film thickness of 100 to 500 angstroms.

9. The method according to claim 1, wherein the supply of oxidizing gas is controlled in such that the partial pressure ratio between the oxidizing gas and the copper source gas becomes not more than 2.

10. The method according to claim 1, wherein the concentration of oxygen in said first conductive thin film is 1 atomic % or less.

11. A method of manufacturing a semiconductor device comprising the steps of;

forming an intermediate thin film which is either one of a diffusion-preventing thin film or a glue thin film on a substrate;

performing a first vapor deposition by supplying a source gas comprising a copper-containing organometallic compound and an oxidizing gas over the intermediate thin film thereby to allow a first conductive thin film containing copper as a main component and a trace of oxygen to be grown through a chemical vapor deposition;

performing a second vapor deposition by supplying the source gas without supplying the oxidizing gas thereby to allow a second conductive thin film mainly containing copper to be grown through a chemical vapor deposition; on said first conductive film and heat-treating said first and second conductive thin films at a temperature which is higher than those employed in said first and second vapor depositions.

12. The method according to claim 11, wherein said intermediate thin film is selected from the group consisting of refractory metals; nitrides of refractory metals; silicides of refractory metals; and a ternary alloy comprising a refractory metal, Si and N.

13. The method according to claim 12, wherein said refractory metal is selected from the group consisting of Nb, Ta and W.

14. The method according to claim 11, wherein said oxidizing gas is selected from the group consisting of oxygen gas, ozone and water.

15. The method according to claim 11, wherein the temperature of the substrate at said first and second vapor depositions is 200° C. or lower.

16. The method according to claim 11, wherein said organic copper compound is of a molecular structure having Lewis base linked via oxygen atom to copper atom.

17. The method according to claim 16, wherein said organic copper compound is a β-diketonate compound.

18. The method according to claim 11, wherein said first conductive thin film has a film thickness of 100 to 500 angstroms.

19. The method according to claim 11, wherein the heat treatment temperature of said first and second conductive thin films are in the range of 300° C. or more.

20. The method according to claim 11, wherein the heat treatment temperature of said first and second conductive thin films are 300° C. to 500° C.

21. The method according to claim 11, wherein the supply of oxidizing gas is controlled in such that the partial pressure ratio between the oxidizing gas and the copper source gas becomes not more than 2.

22. The method according to claim 11, wherein the concentration of oxygen in said first conductive thin film is 1 atomic % or less.

* * * * *